United States Patent
Pudas et al.

(10) Patent No.: US 12,351,915 B2
(45) Date of Patent: Jul. 8, 2025

(54) POROUS INLET

(71) Applicant: Picosun Oy, Espoo (FI)

(72) Inventors: Marko Pudas, Masala (FI); Juhana Kostamo, Masala (FI)

(73) Assignee: Picosun Oy, Espoo (FI)

( * ) Notice: Subject to any disclaimer, the term of this patent is extended or adjusted under 35 U.S.C. 154(b) by 256 days.

(21) Appl. No.: 17/615,247

(22) PCT Filed: Jun. 6, 2019

(86) PCT No.: PCT/FI2019/050433
§ 371 (c)(1),
(2) Date: Nov. 30, 2021

(87) PCT Pub. No.: WO2020/245492
PCT Pub. Date: Dec. 10, 2020

(65) Prior Publication Data
US 2022/0235466 A1 Jul. 28, 2022

(51) Int. Cl.
*H01J 37/32* (2006.01)
*C23C 16/455* (2006.01)
*C23C 16/52* (2006.01)

(52) U.S. Cl.
CPC .............. *C23C 16/45561* (2013.01); *C23C 16/45519* (2013.01); *C23C 16/45544* (2013.01);
(Continued)

(58) Field of Classification Search
CPC ........ C23C 16/45561; C23C 16/45519; C23C 16/45544; C23C 16/45563; C23C 16/52;
(Continued)

(56) References Cited

U.S. PATENT DOCUMENTS

| 4,670,145 A | 6/1987 | Edwards |
| 4,981,722 A | 1/1991 | Möller et al. |

(Continued)

FOREIGN PATENT DOCUMENTS

| CN | 1890792 A | | 1/2007 |
| JP | 62221108 A | * | 9/1987 |

(Continued)

OTHER PUBLICATIONS

European Patent Office, Extended European Search Report ,Application No. 19931772.8-1103 / 3980575, PCT/FI2019050433, dated Feb. 13, 2023, 10 pages.

(Continued)

*Primary Examiner* — Rudy Zervigon
(74) *Attorney, Agent, or Firm* — Espatent Oy

(57) ABSTRACT

A substrate processing apparatus including a reaction chamber with an inlet opening, an in-feed line to provide a reactive chemical into the reaction chamber via the inlet opening, incoming gas flow control means in the in-feed line, the in-feed line extending from the flow control means to the reaction chamber, the in-feed line in this portion between the flow control means and the reaction chamber having the form of an inlet pipe with a gas-permeable wall, the inlet pipe with the gas-permeable wall extending towards the inlet opening through a volume at least partly surrounding the inlet pipe, and the apparatus (100, 800) being configured to provide fluid to surround and enter the inlet pipe in said portion.

23 Claims, 13 Drawing Sheets

(52) U.S. Cl.
CPC ........ *C23C 16/45563* (2013.01); *C23C 16/52* (2013.01); *H01J 37/32449* (2013.01)

(58) Field of Classification Search
CPC ............ C23C 16/4404; C23C 16/4408; C23C 16/4412; C23C 16/452; C23C 16/45512; C23C 16/45521; C23C 16/45536; C23C 16/4557; C23C 16/45574; C23C 16/45576; H01J 37/32449; H01J 37/3244; H01L 21/67017
USPC ........................ 118/715; 156/345.34, 345.35
See application file for complete search history.

(56) References Cited

U.S. PATENT DOCUMENTS

| | | | |
|---|---|---|---|
| 4,994,107 | A | 2/1991 | Flagan et al. |
| 5,356,120 | A | 10/1994 | Konig et al. |
| 5,391,232 | A | 2/1995 | Kanai et al. |
| 5,846,275 | A | 12/1998 | Lane et al. |
| 6,367,412 | B1 | 4/2002 | Ramaswamy et al. |
| 6,506,253 | B2 | 1/2003 | Sakuma |
| 6,903,030 | B2* | 6/2005 | Ishii .................. H01L 21/67109 118/724 |
| 7,900,580 | B2* | 3/2011 | Kontani ............ C23C 16/45578 156/345.43 |
| 8,211,235 | B2 | 7/2012 | Lindfors et al. |
| 10,006,146 | B2* | 6/2018 | Park .................. H01L 21/67201 |
| 2001/0021593 | A1 | 9/2001 | Sakai et al. |
| 2006/0196418 | A1 | 9/2006 | Lindfors et al. |
| 2007/0110975 | A1 | 5/2007 | Schneweis |
| 2007/0187363 | A1* | 8/2007 | Oka .................. H01J 37/32449 156/345.33 |
| 2009/0260572 | A1* | 10/2009 | Kim .................. C23C 16/45508 118/730 |
| 2009/0263578 | A1 | 10/2009 | Lindfors et al. |
| 2011/0294283 | A1 | 12/2011 | Brien et al. |
| 2012/0100292 | A1* | 4/2012 | Park .................... C23C 16/4584 118/725 |
| 2012/0180727 | A1* | 7/2012 | Hasegawa ......... C23C 16/45576 118/730 |
| 2013/0089490 | A1 | 4/2013 | Filtvedt et al. |
| 2013/0146225 | A1 | 6/2013 | Chen et al. |
| 2014/0339330 | A1* | 11/2014 | Hong ................ C23C 16/45578 239/589.1 |
| 2015/0275369 | A1* | 10/2015 | Terada .................... C30B 31/16 118/715 |
| 2017/0253971 | A1* | 9/2017 | Kawamorita ..... C23C 16/45578 |
| 2023/0290613 | A1* | 9/2023 | Sharma ............. H01J 37/32449 |

FOREIGN PATENT DOCUMENTS

| | | |
|---|---|---|
| JP | S62221108 A | 9/1987 |
| JP | H0410617 A | 1/1992 |
| JP | H04107809 A | 4/1992 |
| JP | 2003347227 A | 12/2003 |
| JP | 2005243979 A | 9/2005 |
| JP | 2007514306 A | 5/2007 |
| JP | 2009033000 A | 2/2009 |
| JP | 2010280945 A | 12/2010 |
| JP | 2011124424 A | 6/2011 |
| JP | 2015209355 A | 11/2015 |
| WO | 2018234611 A1 | 12/2018 |

OTHER PUBLICATIONS

Japanese Patent Office, Notification of Ground of Rejection, Application No. 2021-571500, Mailed May 24, 2023, 5 pages, English Translation, 4 pages.
International Search Report, Application No. PCT/FI2019/050433, Mailed Feb. 26, 2020, 4 pages.
Written Opinion of The International Searching Authority, Application No. PCT/FI2019/050433, Mailed Feb. 26, 2020, 6 pages.
China Patent Office, First Office Action, Application No. 2019800971088, Aug. 16, 2023, 6 pages.
China Patent Office, Search Report, Application No. 2019800971088, Aug. 10, 2023, 3 pages.

* cited by examiner

POROUS INLET

FIELD

The disclosed embodiments generally relate to substrate processing methods and apparatus, in particular to chemical deposition and etching methods and deposition and etching reactors. More particularly, but not exclusively, the disclosed embodiments relate to atomic layer deposition (ALD) reactors.

BACKGROUND

This section illustrates useful background information without admission of any technique described herein representative of the state of the art. The described reactor structure can however be better understood, for example, by considering the granted U.S. Pat. No. 8,211,235 B2.

In chemical deposition methods chemicals are provided into a reaction chamber by at least one in-feed line. The in-feed lines typically extend through a heated volume on their way into the reaction chamber. However, this increases the risk of the chemicals sticking onto the walls of the in-feed lines or otherwise react with the walls of the in-feed lines.

SUMMARY

Accordingly, the aspects of the disclosed embodiments are directed to providing a method and apparatus with minimized sticking of chemical or plasma on the infeed-line(s).

More generally, of the aspects of the disclosed embodiments are directed to providing a method and apparatus with minimized sticking of chemical or plasma on the walls of vacuum parts. Examples of vacuum parts herein are the in-feed line(s), reaction chamber, substrate holder (susceptor) and a pump fore-line via which some reaction products and residual gases exit from the reaction chamber towards a pump (for exhaust). The sticking may refer to physical adsorption down to one molecular layer in thickness.

According to a first example aspect of the disclosed embodiments there is provided a substrate processing apparatus, comprising:
a reaction chamber with an inlet opening;
an in-feed line to provide a reactive chemical into the reaction chamber via the inlet opening;
incoming gas flow control means in the in-feed line, the in-feed line extending from the flow control means to the reaction chamber, the in-feed line in this portion between the flow control means and the reaction chamber having the form of an inlet pipe with a gas-permeable wall, the inlet pipe with the gas-permeable wall extending towards the inlet opening through a volume at least partly surrounding the inlet pipe, and
the apparatus being configured to provide fluid to surround and enter the inlet pipe in said portion.

In certain embodiments, the gas-permeable wall is a wall formed of gas-passing pathways. The gas-passing pathways may include pores. There may be provided a multitude of gas-passing pathways providing a protective flow extending along the whole inner surface of the inlet pipe. In certain embodiments, the gas-permeable wall is a porous wall. In certain embodiments, the wall in itself is gas-permeable. In certain embodiments, the wall comprises at least 100 gas-passing pathways. In certain embodiments, the wall comprises at least 1000 gas-passing pathways. In certain embodiments, the wall comprises a section in which the gas-passing pathways are spread over the whole circumference of the inlet pipe and over a longitudinal distance of the inlet pipe.

In certain embodiments, the gas-permeable wall in itself is gas-permeable in contrast to pipes having walls with individual openings or specific injection channels. In certain embodiments, the gas-permeable wall has perforations or contains openings or gas-passing pathways throughout the gas-permeable wall section or area. In certain embodiments, the said openings or gas-passing pathways are provided in a uniform manner. In certain embodiments, the gas-permeability of the gas-permeable wall is an integral feature or property of the inlet pipe.

In certain embodiments, the gas-permeable wall extends to the inlet opening. However, in other embodiments the gas-permeable wall does not extend to the inlet opening, but it only extends towards the inlet opening. In such embodiments, an edge of the reaction chamber close to the inlet opening or at the inlet opening may be a hot or heated edge to reduce sticking.

In certain embodiments, the incoming gas flow control means comprise a valve. In certain embodiments, the incoming gas flow control means comprise a pulsing valve. In certain embodiments, the incoming gas flow control means comprise a three-way valve (or an ALD valve) or a four-way valve. Examples of such valves have been presented in WO 2018/202935 A1, and WO 2018/202949 A1. In certain embodiments, the incoming gas flow control means comprise other flow control means in addition or instead of the means described hereinbefore.

In certain embodiments, the volume at least partly surrounding the in-feed line is a volume outside of the reaction chamber. In certain embodiments, the volume at least partly surrounding the in-feed line is a volume at least partly surrounding the reaction chamber, for example an intermediate space in between the wall of the reaction chamber and an outer chamber (or vacuum chamber) wall.

In certain embodiments, the fluid to surround and enter the inlet pipe is higher pressure fluid. In certain embodiments, the expression "higher pressure" refers to the pressure of the fluid surrounding the inlet pipe to be higher than the pressure of the gas or fluid that flows within the inlet pipe (before mixing with the surrounding fluid).

In certain embodiments, the apparatus comprises means to provide said higher pressure fluid.

In certain embodiments, the apparatus is configured to prevent the reactive chemical from adhering to an inner surface of the inlet pipe.

In certain embodiments, the apparatus comprises:
an outer tube around the inlet pipe configured to provide said at least partly surrounding volume.

In certain embodiments, the outer tube is formed of a gas-impermeable wall.

In certain embodiments, the apparatus comprises:
an outer tube (or pipe) around the inlet pipe configured to provide the fluid to surround and enter the inlet pipe.

In certain embodiments, the surrounding fluid is gas. In certain embodiments, the surrounding fluid is inactive gas.

In certain embodiments, the apparatus is configured to pass inactive gas in between the inlet pipe and the outer tube.

In certain embodiments, the apparatus is configured to pass reactive fluid in between the inlet pipe and the outer tube causing a reaction between the reactive chemical and said reactive fluid within the inlet pipe. In certain embodiments, powder is formed in such a reaction.

In certain embodiments, the apparatus is configured to pass reactive fluid in between the inlet pipe and the outer tube causing a reaction between the reactive chemical and said reactive fluid within the inlet pipe to produce another chemical, ion, radical or other such form, species. Such species thus formed will then react within the reaction chamber with another precursor causing a surface reaction on a substrate therein. Accordingly, in certain embodiments, a chemical that is initially not reactive with another chemical may be caused to become reactive with said another chemical by activating it by material flowing through the gas permeable wall.

In certain embodiments, the apparatus comprises:
an outer chamber around the reaction chamber, the outer chamber forming the volume surrounding the reaction chamber.

In certain embodiments, the apparatus comprises a feed-through in the outer chamber wall to pass inactive gas into the intermediate space.

In certain embodiments, the apparatus comprises an intermediate space in between the reaction chamber and an outer chamber wall, the intermediate space providing a volume at least partly surrounding the in-feed line.

In certain embodiments, the apparatus is configured to pump both the reaction chamber and the outer chamber into vacuum. A same pump or separate pumps may be used.

In certain embodiments, the apparatus comprises a heater in said at least partly surrounding volume.

In certain embodiments, the apparatus is configured to provide heating or cooling of the reactive chemical within the inlet pipe by thermal radiation or by the surrounding fluid (or by said higher pressure fluid) which is provided with a higher or lower temperature.

In certain embodiments, reactive chemical (or precursor) is pulsed via a valve (for example the pulsing valve or three-way valve) into the inlet pipe. In certain embodiments, the valve is a four-way valve.

In certain embodiments, the apparatus is configured to provide heating or cooling of the reactive chemical within the inlet pipe by said higher pressure fluid, where fluid in the outer tube is heated or cooled by a different method than the fluid in the inner pipe.

In certain embodiments, the inlet pipe comprises means of heating the inlet pipe.

In certain embodiments, the outer tube comprises means of heating the outer tube.

In certain embodiments, the apparatus comprises at least one heater element in a space in between the inlet pipe and the outer tube. In some embodiments, the at least one heater element is integrated with a surface of the inlet pipe.

In certain embodiments, the apparatus comprises in addition or instead of the at least one heater element at least one cooler element in the space in between the inner pipe and the outer tube. In certain embodiments, the cooler element applies a liquid circulation for cooling, with an external heat exchanger.

In certain embodiments, the gas or fluid flowing through the gas-permeable wall into the inlet pipe is colder than the gas or fluid already existing within the inlet pipe, or becomes colder due to an expansion through the gas-permeable wall into the inlet pipe.

The inlet pipe with a gas-permeable wall may be implemented, for example, by porous material such as sintered polymer, sintered metal, 3D printed material with a possible sintering step of metal or ceramic, or ceramic material(s). A specific example of porous material is material that is composed of aluminum oxide and silicon oxide (also known as Pormulit). Any solution of porous material may contain a varied grade of porosity, or e.g. fluid channels within it. A benefit of such channels, easily formed by 3D printing for example, can for example balancing or outflow at different points on the material surface.

In certain embodiments, the inlet pipe comprises at least one of the following: a gas-permeable pipe, a porous pipe, a perforated pipe, and a pipe section or sections with at least one gas-permeable gap or a plurality gas-permeable gaps. Such gaps or holes, in certain embodiments, form gas ejectors or structures which generate a choked flow effect. The gas-permeable/porous area may have different densities of openings, or it may be formed of any combination of the aforementioned structures or means in order to lead the fluid to pass through the wall.

In certain embodiments, the apparatus comprises an additional opening outside of the inlet pipe providing a flow path from outside of the reaction chamber into the reaction chamber. This flow path is additional to a flow path provided by the in-feed line (or inlet pipe). If the apparatus comprises the outer tube surrounding the inlet pipe, said additional opening can be positioned outside of the inlet pipe but inside of the outer tube. In certain embodiments, the apparatus comprises an additional opening from the outer tube directly to the reaction chamber. In certain embodiments, the fluid within the outer tube has two routes to enter the reaction chamber, one through said additional opening outside of the inlet pipe and one via the inlet pipe and through the inlet opening. Said additional opening may be arranged in a reaction chamber wall. In certain embodiments, said opening is adjustable, e.g., adjustable in size.

In certain embodiments, the apparatus is configured to provide the outer tube with a lower pressure, and the outer tube is open to the reaction chamber via said additional opening positioned outside of the inlet pipe but inside of the outer tube. This provides in certain embodiments a temperature separation between the inlet pipe and the intermediate space surrounding the outer tube.

In certain embodiments, the apparatus comprises within the inlet pipe one or more separate fluid channels. Separate herein means that any material flowing within the separate fluid channels is in no fluid communication with the reactive chemical flow in the inlet pipe. As an example, the channel(s) may be made of 3D printed material. In further embodiments, the channel may be a welded pipe. In certain embodiments, the channel has a spiral form. The channel(s) may be air channel(s). The channel(s) may be located on the inner surface of the inlet pipe. The channels may provide the inlet pipe with a heating or a cooling effect by flowing fluid within the channel having a temperature different from the temperature of reactive chemical flow in the inlet pipe.

In certain embodiments, the incoming gas flow control means is or comprises a three-way valve or a four-way valve.

In certain embodiments, the apparatus comprises a second inlet pipe with a gas permeable wall surrounded by a second outer tube upstream of the incoming gas flow control means. In certain embodiments, the volume in between the inlet pipe and the outer tube is not in direct fluid communication with the volume in between the second inlet pipe and the second outer tube.

In certain embodiments, the outer tube comprises a heat-insulating layer, or the apparatus comprises a heat-insulating layer around the outer tube.

In certain embodiments, the apparatus comprises a plurality of separate and successive gas volumes surrounding the gas-permeable wall inlet pipe in the flow direction of the inlet pipe.

In certain embodiments, the inlet pipe has a gas-permeable wall or is porous, and the outer tube is omitted. In certain such an embodiment, gas from an intermediate space between a reaction chamber wall and an outer (chamber) wall flow (directly) through the inlet pipe. A vacuum chamber may be provided as the outer chamber.

In certain embodiments, said intermediate space is omitted, but the inlet pipe and the outer tube are provided outside of the reaction chamber. A heater may be integrated with a reaction chamber outer surface. Alternatively, heating may be provided only for the incoming gases.

In certain embodiments, the apparatus comprises a particle filter at a reaction chamber end of the inlet pipe.

In certain embodiments, the apparatus comprises an outlet channel from the space between the inlet pipe and the outer tube to a pump (for exhaust). In certain embodiments, the outlet channel begins at the reaction chamber end of the volume defined by an outer surface of the inlet pipe and an inner surface of the outer tube.

In certain embodiments, the apparatus comprises a vertical in-feed line approaching the reaction chamber from the top.

In certain embodiments, the outer tube is flexible in at least length wise direction, enabling an attachment to the reaction chamber and/or a flexible attachment outside of the vacuum chamber as presented in the PCT/FI2017/050465.

In certain embodiments, the inlet pipe comprises segments of areas, where different gases or a mixture of different gases are brought into a gas stream flowing inside of the inlet pipe.

In certain embodiments, the surface material of the gas-permeable wall and the fluid flowing through the wall to inside of the inlet pipe are selected with suitable temperatures and solid material surface to create catalytic reaction(s).

In certain embodiments, the surface material of the gas-permeable wall and the gas flowing through the wall to inside of the inlet pipe are selected with temperatures to create catalytic reaction(s).

In certain embodiments, electromagnetic radiation is induced into the inlet to affect the catalytic reaction.

In certain embodiments, the apparatus is configured to perform sequential self-saturating surface reactions on a substrate surface in the reaction chamber. Accordingly, the apparatus is configured to apply atomic layer deposition, ALD. The substrate may be a wafer.

In certain embodiments, the apparatus is configured to generate powder.

In certain embodiments, the apparatus is configured to perform etching reactions on a substrate surface in the reaction chamber.

In certain embodiments, the gas passing through the gas-permeable wall is mixed with gas flowing in the in-feed line upstream of the three-way valve (or incoming gas flow control means).

In certain embodiments, the gas-permeable wall of the inlet pipe extends upstream of the pulsing valve/incoming gas flow control means so that the gas coming through the gas-permeable wall can be mixed with gas flowing within the inlet pipe before the pulsing valve/incoming gas flow control means.

In certain embodiments, the valve/incoming gas flow control means is located in the intermediate space.

In certain embodiments, the inlet pipe has at least one curved shape causing the fluid flow to change direction or have a separating force for particles (such as a spiral).

In certain embodiments, the valve attached to the inlet pipe consists of multiple valves or means to select from at least two different gases.

In certain embodiments, a section after valve(s) comprises or consists of a mixer (or flow direction guide). In certain embodiments, the mixer receives more than one different gas line, which may pass more than one gas or gases with different pressures or different temperatures. In certain embodiments, such a structure forms further protective flow(s) around edges of the gas-permeable pipe wall. In certain embodiments, such a structure may accelerate gas with an ejector or a choked flow effect.

In certain embodiments, the gas-permeable pipe wall is adapted to change its width over its length.

In certain embodiments, the gas-permeable pipe is adapted to form mixing of at least two incoming branches. In certain embodiments, the gas-permeable pipe is adapted for expanding to at least two outgoing branches. Accordingly, in certain embodiments, at least two outlets lead from the gas-permeable pipe (inlet pipe) to the reaction chamber. These structures facilitate establishing desired chemical reactions between chemicals before the reaction chamber if required. Cleaning after the said chemical reactions may be performed, e.g., by applying the said filter at a reaction chamber end of the inlet pipe which may, e.g., remove particles from a passing flow.

In certain embodiments, the inlet pipe is adapted so that it points to the substrate.

In certain embodiments, a plasma formation is arranged at least partially within the inlet pipe. This can be done, for example, with an RF plasma generator, placed outside of the inlet pipe. The international patent publication WO 2012/136875 shows an example of the placement. In certain embodiments, the surrounding gas flow entering the inlet pipe keeps the plasma away from the inlet pipe walls. In certain embodiments, the flow(s) are arranged to push the plasma towards the substrate, and in yet further embodiments, to enable small non-uniformity. In certain embodiments, the small non-uniformity is obtained by modifying the flow, for example with a variation in the gas flow in the inlet pipe structure.

In certain further embodiments, instead of the surrounding gas entering the inlet pipe, the pressures are controlled to such an extent that the flow direction is from the inside of the inlet pipe through the gas-permeable wall to the outside of the inlet pipe.

In certain embodiments, the reaction chamber has gas-permeable walls. In certain embodiments, the reaction chamber walls are formed of gas-passing pathways. The gas-passing pathways may include pores. There may be provided a multitude of gas-passing pathways providing a protective flow extending along the whole inner surface of the reaction chamber. In certain embodiments, the reaction chamber is formed of porous material.

In certain embodiments, the reaction chamber with gas-permeable walls is surrounded, at least partly, by a volume. In certain embodiments, the volume is an intermediate space formed between the gas-permeable wall of the reaction chamber and an outer chamber wall. In certain other embodiments, the volume is defined by the gas-permeable wall of the reaction chamber and an outer intermediate wall, the outer intermediate wall residing in between the gas-permeable wall of the reaction chamber and the outer chamber wall. In certain embodiments, the apparatus is configured to provide fluid to surround and enter the reaction chamber from the surrounding volume through the gas-permeable wall of the reaction chamber.

In certain embodiments, the apparatus comprises a substrate holder formed of porous material. In certain embodiments, the apparatus comprises a substrate holder comprising at least one gas-permeable wall.

In certain embodiments, the apparatus comprises a substrate holder, wherein at least a surface of the substrate holder facing a substrate is formed of gas-passing pathways. The gas-passing pathways may include pores. In certain embodiments, the surface of the substrate holder facing a substrate is porous.

In certain embodiments, the apparatus comprises a pump fore-line downstream of the reaction chamber, the pump fore-line having the form of a pipe with a gas-permeable wall.

In certain embodiments, the pipe with a gas-permeable wall of the pump fore-line is surrounded by an outer tube having a gas-impermeable wall.

According to a second example aspect of the disclosed embodiments there is provided a method of operating the substrate processing apparatus of the first aspect and any of its embodiments.

Accordingly, the second example aspect comprises:
providing a reactive chemical into a reaction chamber of the apparatus via an in-feed line and through a reaction chamber inlet opening;
controlling the in-feed line by incoming gas flow control means, the in-feed line extending from the flow control means to the reaction chamber, the in-feed line in this portion between the flow control means and the reaction chamber having the form of an inlet pipe with a gas-permeable wall, the inlet pipe with the gas-permeable wall extending towards the inlet opening through a volume at least partly surrounding the inlet pipe; and
providing fluid to surround and enter the inlet pipe in said portion.

In certain embodiments, the method comprises:
providing an outer tube around the inlet pipe to provide said at least partly surrounding volume.

In certain embodiments, the method comprises:
passing inactive gas into the outer tube.

In certain embodiments, the method comprises:
causing a reaction between the reactive chemical and reactive fluid within the inlet pipe by passing said reactive fluid in between the inlet pipe and the outer tube.

In certain embodiments, the method comprises:
providing an intermediate space in between the reaction chamber and an outer chamber wall, the intermediate space providing a volume at least partly surrounding the in-feed line.

In certain embodiments, the method comprises:
passing inactive gas into the intermediate space via a feedthrough in the outer chamber wall.

In certain embodiments, the method comprises:
heating the at least partly surrounding volume by a heater.

In certain embodiments, the method comprises:
heating the apparatus by at least one heater element placed in a space in between the inlet pipe and the outer tube.

In certain embodiments, the method comprises:
heating or cooling of the reactive chemical within the inlet pipe by the surrounding fluid.

In certain embodiments, the method comprises:
providing a flow into the reaction chamber directly from the outer tube.

In certain embodiments, the method comprises:
establishing a gas flow into the reaction chamber directly from the outer tube through an opening arranged in the reaction chamber wall.

In certain embodiments, the method comprises:
controlling gas flow within the in-feed line by a three-way valve.

In certain embodiments, the method comprises:
providing a second inlet pipe with a gas permeable wall surrounded by a second outer tube upstream of the incoming gas flow control means, and
providing fluid to surround and enter the second inlet pipe.

In certain embodiments, the method comprises:
insulating the outer tube by a heat-insulating layer.

In certain embodiments, the method comprises:
providing a plurality of separate and successive gas volumes surrounding the gas-permeable wall inlet pipe in the flow direction of the inlet pipe.

In certain embodiments, the method comprises:
removing particles with a particle filter at a reaction chamber end of the inlet pipe.

In certain embodiments, the method comprises:
exhausting material from the space between the inlet pipe and the outer tube to an outlet channel by-passing the reaction chamber.

In certain embodiments, the method comprises:
approaching the reaction chamber from the top by a vertical in-feed line.

In certain embodiments, the method comprises:
performing sequential self-saturating surface reactions on a substrate surface in the reaction chamber.

In certain embodiments, the reaction chamber comprises gas-permeable wall(s), and the method comprises:
providing fluid to surround and enter the reaction chamber through the gas permeable wall(s).

In certain embodiments, the reaction chamber is formed of porous material.

In certain embodiments, a substrate holder comprises at least one gas-permeable wall. The substrate holder may support one or more substrates within the reaction chamber.

In certain embodiments, the method comprises:
providing an interior of the substrate holder with fluid, said fluid entering from the interior of the substrate holder to the reaction chamber through the at least one gas-permeable wall.

In certain embodiments, the method comprises:
pumping both the reaction chamber and the outer chamber into vacuum.

According to certain further aspects of the disclosed embodiments certain further methods and apparatus are provided. In these further aspects, the embodiments presented in connection with the first and second aspect will generally apply. However, the further aspects do not contain each of the limitations that the first and second aspect contain.

Thus, according to a further example aspect there is provided a substrate processing apparatus, comprising:
a reaction chamber with an inlet opening;
an in-feed line to provide a reactive chemical into the reaction chamber via the inlet opening; and
a portion in the in-feed line upstream of the inlet opening having the form of an inlet pipe with a gas-permeable wall.

According to a further example aspect there is provided a method, comprising:
 providing a reactive chemical into a reaction chamber of a substrate processing apparatus via an in-feed line and through a reaction chamber inlet opening, the in-feed line upstream of the inlet opening comprising a portion in the form of an inlet pipe with a gas-permeable wall, the method further comprising:
 providing a fluid to enter inside of the inlet pipe from the outside of the inlet pipe through the gas-permeable wall.

According to a yet further example aspect there is provided a substrate processing apparatus, comprising:
 a reaction chamber;
 an in-feed line to provide a reactive chemical into the reaction chamber;
 a vacuum chamber at least partly surrounding the reaction chamber;
 an intermediate space in between a wall of the reaction chamber and a wall of the vacuum chamber, the in-feed line comprising a gas-permeable wall in the area of the intermediate space.

According to a yet further example aspect there is provided a method, comprising:
 providing a reactive chemical into a reaction chamber of a substrate processing apparatus via an in-feed line
 providing a vacuum chamber to surround the reaction chamber and an intermediate in between a wall of the reaction chamber and a wall of the vacuum chamber; and
 flowing fluid from the intermediate space to the in-feed line through a gas-permeable wall of the in-feed line.

According to a yet further example aspect there is provided a substrate processing apparatus, comprising:
 a reaction chamber;
 an in-feed line to provide a reactive chemical into the reaction chamber, the in-feed line being in the form of an inner pipe with a gas-permeable wall and an outer tube surrounding the inner pipe.

In certain embodiments, the outer tube comprises heat insulation against its surroundings.

According to a yet further example aspect there is provided a substrate processing apparatus, comprising:
 a reaction chamber with gas-permeable wall(s).

According to a yet further example aspect there is provided a substrate processing apparatus, comprising:
 a substrate holder with gas-permeable wall(s).

According to a yet further example aspect there is provided a substrate holder, comprising gas-permeable wall(s).

Accordingly, the reaction chamber and/or substrate holder each comprise a gas-permeable wall or gas permeable walls.

According to a yet further example aspect there is provided a pipe exiting the reaction chamber, comprising gas-permeable wall(s).

What is described concerning the gas-permeable wall(s) of the inlet pipe applies also to the other parts having gas-permeable wall(s) in the same or different embodiments or aspects. Said other parts herein mean e.g. the reaction chamber with gas-permeable wall(s), the substrate holder with gas-permeable wall(s), and fore-line (pump fore-line) with gas-permeable wall(s) leading from the reaction chamber to the pump. Accordingly, the gas-permeable wall(s) of these other parts may also be porous, and corresponding features and solutions described in the context of the inlet pipe are also applicable to the aspects and embodiments concerning said other parts etc., etc.

Different non-binding example aspects and embodiments have been presented in the foregoing. The above embodiments and embodiments described later in this description are used to explain selected aspects or steps that may be utilized in implementations of the present disclosure. It should be appreciated that corresponding embodiments apply to other example aspects as well. Any appropriate combinations of the embodiments can be formed.

BRIEF DESCRIPTION OF THE DRAWINGS

The disclosed embodiments will now be described, by way of example only, with reference to the accompanying drawings, in which.

DETAILED DESCRIPTION

Figure 1:
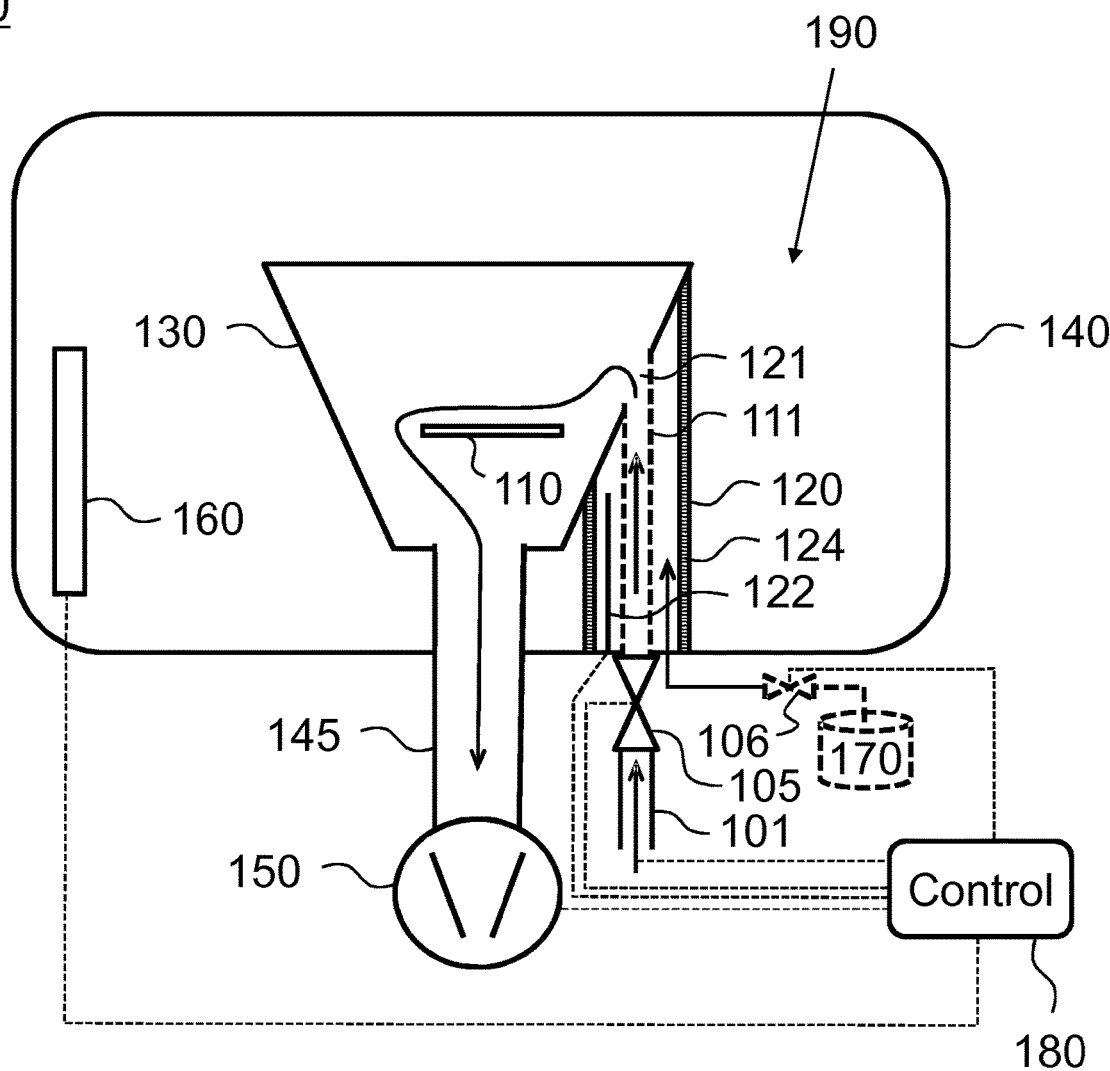
FIG. 1 shows an apparatus in accordance with certain embodiments.

In the following description, Atomic Layer Deposition (ALD) technology is used as an example. However, the disclosed embodiments are not limited to ALD technology, but it can be exploited in a wide variety of substrate processing apparatuses, for example, in Chemical Vapor Deposition (CVD) reactors, or in etching reactors, such as in Atomic Layer Etching (ALE) reactors.

The basics of an ALD growth mechanism are known to a skilled person. ALD is a special chemical deposition method based on the sequential introduction of at least two reactive precursor species to at least one substrate. It is to be understood, however, that one of these reactive precursors can be substituted by energy when using, for example, photon-enhanced ALD or plasma-assisted ALD, for example PEALD, leading to single precursor ALD processes. For example, deposition of a pure element requires only one precursor. Binary compounds, such as oxides can be created with one precursor chemical when the precursor chemical contains both of the elements of the binary material to be deposited. Thin films grown by ALD are dense, pinhole free and have uniform thickness.

As for substrate processing steps, the at least one substrate is typically exposed to temporally separated precursor pulses in a reaction vessel to deposit material on the substrate surfaces by sequential self-saturating surface reactions. In the context of this application, the term ALD comprises all applicable ALD based techniques and any equivalent or closely related technologies, such as, for example the following ALD sub-types: MLD (Molecular Layer Deposition), plasma-assisted ALD, for example PEALD (Plasma Enhanced Atomic Layer Deposition) and photon-enhanced Atomic Layer Deposition (known also as photo-ALD or flash enhanced ALD).

Alternatively or in addition, such processing can be targeted for example at the reaction chamber, for example to passivate or clean the reaction chamber.

A basic ALD deposition cycle consists of four sequential steps: pulse A, purge A, pulse B and purge B. Pulse A consists of a first precursor vapor and pulse B of another precursor vapor. Inactive gas and a vacuum pump are typically used for purging gaseous reaction by-products and the residual reactant molecules from the reaction space during purge A and purge B. A deposition sequence comprises at least one deposition cycle. Deposition cycles are repeated until the deposition sequence has produced a thin film or coating of desired thickness. Deposition cycles can also be either simpler or more complex. For example, the cycles can include three or more reactant vapor pulses separated by purging steps, or certain purge steps can be omitted. On the other hand, photo-enhanced ALD has a variety of options, such as only one active precursor, with various options for purging. All these deposition cycles form a timed deposition sequence that is controlled by a logic unit or a microprocessor.

A reaction space is a defined volume within a reaction chamber. The desired chemical reactions, such as deposition, etching, cleaning, activation or exchange reactions typically occur on the substrate surface(s) in the reaction space.

FIG. 1 shows an apparatus in accordance with certain embodiments. The apparatus 100 is a substrate processing apparatus which may be for example an ALD, ALE or CVD reactor. The basic structure of the apparatus 100 may be implemented for example in accordance with R-200 ALD system available from Picosun, Espoo, Finland The apparatus comprises a reaction chamber 130 and an infeed line 101 to provide a reactive chemical (or a mixture of a reactive chemical and carrier gas in certain embodiments) to the reaction chamber 130. The apparatus further comprises a pulsing valve 105 in the in-feed line 101. The state (open/close) of the pulsing valve is controlled by a control system 180.

The apparatus further comprises a volume outside of the reaction chamber 130 and at least partly surrounding the in-feed line 101. In the embodiment shown in FIG. 1, an intermediate space 190 formed between the reaction chamber 130 and an outer chamber (that may be a vacuum chamber) 140 surrounds both the reaction chamber 130 and the in-feed line 101. An outer tube 120 (that has gas-impermeable wall(s)) is placed around the in-feed line 101. The in-feed line 101 extends to the pulsing valve 105 and from the pulsing valve 105 into the reaction chamber 130. In this portion from the pulsing valve 105 to the reaction chamber 130, the in-feed line is in the form of an inlet pipe 111 with a gas-permeable wall (also referred to as a "porous inlet"). The reaction chamber 130 comprises an inlet opening 121, and the inlet pipe 111 with the gas-permeable wall extends to the inlet opening 121. However, in other embodiments the gas-permeable wall does not extend all the way to the inlet opening 121, but it only extends towards the inlet opening 121. In such embodiments, an edge of the reaction chamber 130 close to the inlet opening 121 may be a hot or heated edge to reduce sticking. Depending on the embodiment, the inlet opening 121 is arranged at a bottom part, top part, side or corner(s) of the reaction chamber 130.

The inlet pipe 111 in certain embodiments is a porous pipe or a perforated pipe. The wall of the inlet pipe 111 in certain embodiments comprises a plurality of holes or gaps, in certain embodiments directional holes, and/or sections with gaps or slits. The pipe material used may be for example metal or ceramic. The outer tube 120 as well as the intermediate space 190 surround the inlet pipe 111.

The volume(s) at least partly surrounding the in-feed line 101 can be heated volume(s). In certain embodiments, the reaction chamber 130 (and the intermediate space 190) are heated by a heater 160 placed within the intermediate space 190. The volume within the outer tube 120 (and inlet pipe 111) is heated by a heater 122 placed in between the inlet pipe 111 and the outer tube 120. The heater 122 is controlled by the control system. The outer tube 120 in an embodiment is provided with heat insulation 124, for example a layer of heat reflecting material. In certain embodiments, cooling of the inlet pipe 111 and/or the outer tube 120 is provided respectively by arranging one or more cooler elements.

The reactive chemical that flows within the inlet pipe 111 is prevented from coming to contact or adhering to the (inner) wall of the inlet pipe 111 (or the coming into contact or adherence is reduced) by providing higher pressure fluid (or gas) to surround the inlet pipe 111. Surrounding higher pressure gas is passed into the outer tube 120 via a feed-through or valve or similar. For example, the higher pressure gas may be passed into the outer tube 120 from a gas source 170 via a valve 106. The higher pressure gas enters the interior of the inlet pipe 111 through the gas-permeable wall. The pressure difference between the pressure of the higher pressure gas and the pressure of the reactive gas prevents the reactive gas from attaching to the wall of the inlet pipe 111. In other embodiments, the outer tube 120 is omitted and the surrounding gas in the intermediate space 190 acts as the higher pressure gas (as described later in the connection of FIG. 3). In both cases the higher pressure gas passes through the wall of the inlet pipe and mixes with the reactive gas. The mixture flows via the inlet pipe 111 into the reaction chamber 130 in which a substrate 110 is exposed to sequential self-saturating surface reactions as controlled by the control system 180.

The remaining reactants and reaction by-products (if any) are pumped towards a vacuum pump 150 via a fore-line 145.

In certain embodiments, the apparatus 100 is configured to pump both the reaction chamber 130 and the outer chamber into vacuum 140. Accordingly, the apparatus operates in vacuum conditions.

As mentioned, the pulsing valve 105 is controlled by the control system 180. Similarly, the control system 180 controls the whole operation of the apparatus 100. The control system 180 comprises at least one processor and at least one memory comprising a computer program or software. The software includes instructions or a program code to be executed by the at least one processor to control the apparatus 100. The software may typically comprise an operating system and different applications.

The at least one memory may form part of the apparatus or it may comprise an attachable module. The control system 180 further comprises at least one communication unit. The communication unit provides for an interface for internal communication of the apparatus 100. In certain embodiments, the control system 180 uses the communication unit to send instructions or commands to and to receive data from different parts of the apparatus 100, for example, measuring and control devices, valves, pumps, and heaters, etc.

The control system 180 may further comprise a user interface to co-operate with a user, for example, to receive input such as process parameters from the user. In certain embodiments, the control system 180 may be at least partly implemented by a portable device, or by such external systems as factory automation.

As to the operation of the apparatus 100, the control system 180 controls the process timings of the apparatus in accordance with ALD, for example. In certain embodiments, the apparatus 100 is configured, by means of being programmed, for example, to pass higher pressure gas into the intermediate space or outer tube 120. The passing of higher pressure gas into the intermediate space or outer tube 120 in certain embodiments involves controlling the valve 106 illustrated by one of the dotted lines in FIG. 1.

In certain embodiments, the apparatus 100 is configured to provide heating or cooling of the reactive chemical within the inlet pipe 111 by the higher pressure fluid (higher than the pressure in the inlet pipe 111). In those embodiments, the temperature of the surrounding fluid (gas) is controlled by the control system 180 to achieve the desired heating or cooling effect. In certain example embodiments, a heated surrounding fluid (which can be gas) keeps the whole inlet pipe heated. In certain embodiments, the heated fluid is used to heat up the incoming reactive chemical to the temperature of the reaction chamber 130, or to a temperature above it, i.e., elevated temperature. In certain embodiments, such an elevated temperature enables a reaction between the incoming reactive chemical and the heated fluid. The reaction in certain embodiments is limited to the area of the gas-permeable wall of the inlet pipe 111 or within the inlet pipe 111. In certain embodiments, the heating can be performed with inactive gas entering the inlet pipe 111 through the gas-permeable wall to cause breaking of the reactive chemicals coming through valve 105 to radicals or ions, for example.

Instead of or in addition to the heater 122, the heating of the volume inside of the outer tube 120 and the volume inside of the inlet pipe 111 may be implemented by another heater. Examples of such heaters are as follows: an infrared (IR) heater placed in between the pipes (inlet pipe 111 or outer tube 120) whose IR radiation hits at least one of the pipes or the fluid in at least one of the pipes; a heater element, such as a resistor wire, placed against the inlet pipe 111; a heater element manufactured on the surface of the gas-permeable wall, for example a thick-film wire printed on said surface that may be made, e.g., of silver ink or paste, and a heater manufactured, e.g., molded, into inside of the outer tube 120 in between an outer and inner surface of the tube 120.

In yet further embodiments, fluid (which can be gas) that is reactive with the chemical flowing within the inlet pipe 111 is used as the surrounding fluid. In these embodiments, the surrounding fluid passing through the inlet pipe wall mixes and reacts with the chemical flowing within the inlet pipe 111. In certain embodiments, short life-time chemicals produced in this way can be effectively used in the reactions on the substrate.

In yet further embodiments, the contact of the reactive chemical to the inlet pipe wall is not prevented, but generated, e.g., for a cleaning or catalytic reaction purpose, by adjusting the flow direction through the gas-permeable wall. In certain embodiments, fine structures of pores of holes in the wall are directed to adjust the flow: For non-adhering performance the flow may be towards the reaction chamber 130, whereas for improved mixing of the reactive chemical with the surrounding fluid the flow can be directed away from the reaction chamber 130. In certain implementations and conditions, the gas-permeable inlet pipe's surface is in different temperature than the gas flowing through it, to prevent chemical adhesion to the inlet pipe wall. In other implementations, there is an electrical bias in the gas and the wall of the inlet pipe 111, which decreases or prevents the adhesion of specific species. Such a bias can be used to ionize the chemical in the inlet pipe by such means that the valve 105 is at a bias voltage different than the inlet wall or electrode inside of the inlet 111. Alternatively, the ionization can be performed by chemical decomposition, including, but not limited to photo-excitation known as such for UV-processes. Further the valve 105 can be a place where plasma is generated, and thus the plasma becomes charged gas which is guided by charged surfaces. A charged surface may refer to the presence of a magnetic field.

In the embodiment shown in FIG. 1 as well as in other embodiments, a line providing the higher pressure fluid (from the source 170 or a respective source) may comprise its own gas pressure control (e.g., regulator) and/or flow control not shown in the Figures. The valve 106 (or respective valve) is optional.

Figure 2:
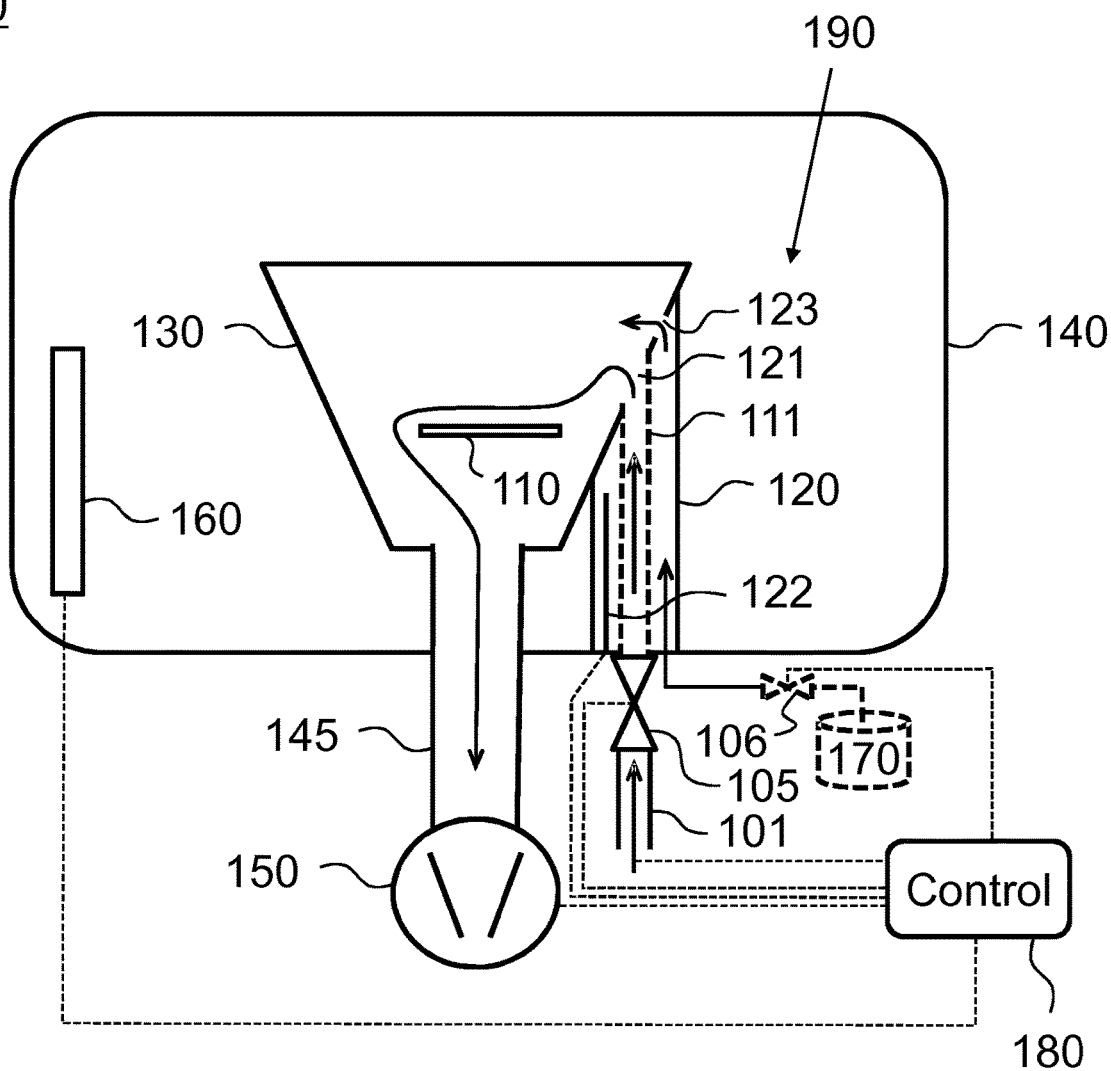
FIG. 2 shows an apparatus in accordance with further embodiments.

FIG. 2 shows an apparatus in accordance with certain further embodiments. The apparatus shown in FIG. 2 corresponds to the structural features and operation of the apparatus shown in FIG. 1 except that the apparatus shown in FIG. 2 comprises an optional opening 123 in the reaction chamber 130 wall directly leading from the outer tube 120 to the reaction chamber 130. The heat insulating layer 124 has not been drawn, but it may be present in the embodiment of FIG. 2.

The opening 123 allows gas flow from the outer tube 120 into the reaction chamber 130 without passing an intermediate element. In certain embodiments, such a gas flow is restricted or adjusted by the control system 180. The mentioned flow to the reaction chamber 130 and/or possible adjustment of the flow in certain embodiments is used to limit the pressure (for example, excessively high pressure) over the gas-permeable wall or pipe 111. In addition or instead, the mentioned flow to the reaction chamber 130 aids in guiding the flow of the chemical(s) coming through the valve 105 and the inlet pipe 111 towards the substrate 110. In certain embodiments, the mentioned flow via the opening 123 is used to purge chemicals incoming into the reaction chamber 130 constantly, even during the pulses (or pulse periods). In certain embodiments, this flow is guided to a pump rather than to the substrate.

Figure 3:
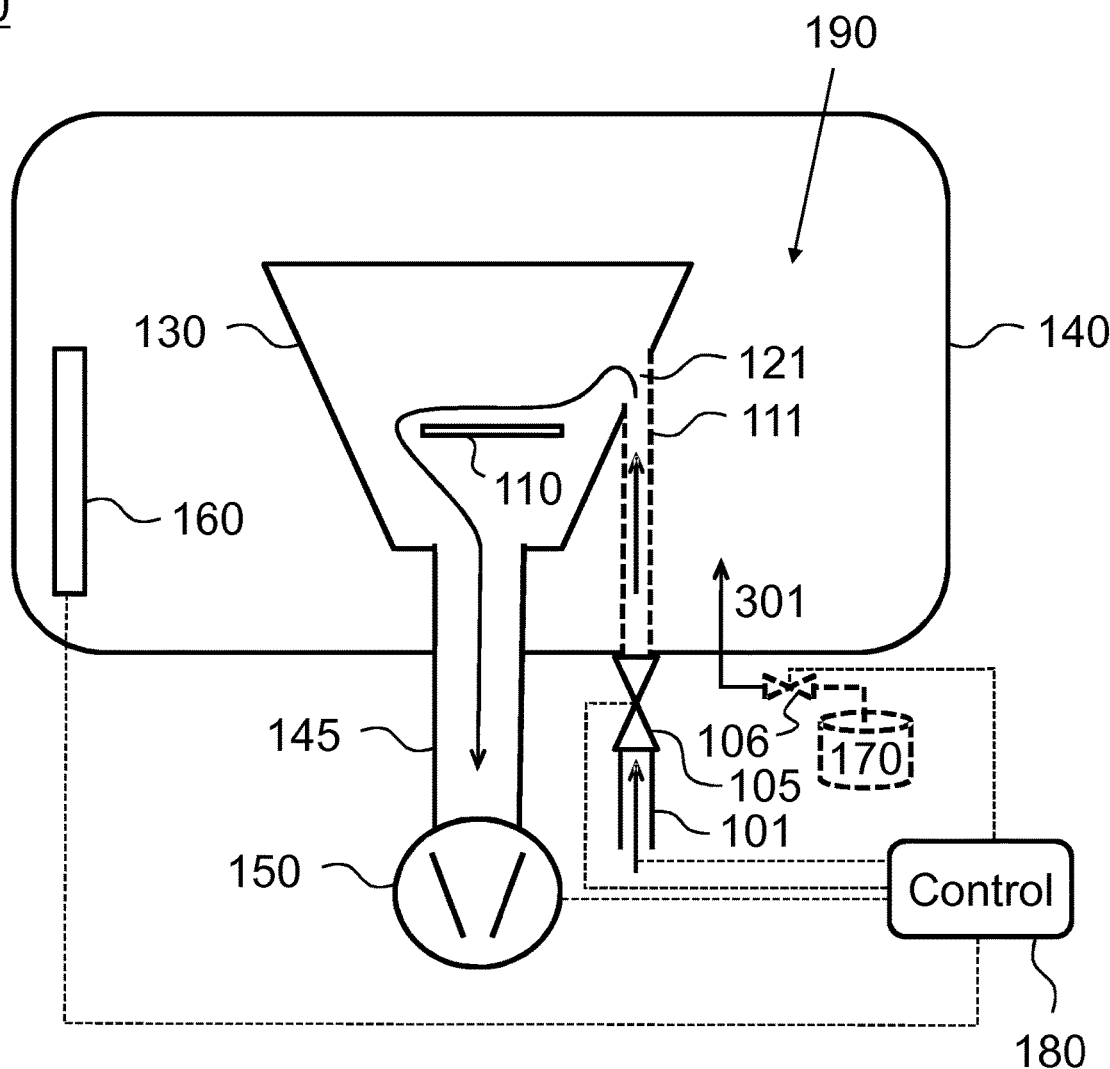
FIG. 3 shows an apparatus in accordance with further embodiments in which an outer tube is omitted.

FIG. 3 shows an apparatus in accordance with certain further embodiments. The apparatus shown in FIG. 3 corresponds to the structural features and operation of the apparatus shown in FIG. 1 except that in the apparatus shown in FIG. 3 the outer tube 120 is omitted. Accordingly, the inlet pipe 111 is directly surrounded by the intermediate space 190. The higher pressure gas is passed into the intermediate space 190 from the gas source 170 via the valve 106 and via an outer chamber 140 feedthrough or similar as depicted by an arrow 301. The higher pressure gas then enters the interior of the inlet pipe 111 through the gas-permeable wall. The pressure difference between the pressure of the higher pressure gas and the pressure of the reactive gas prevents the reactive gas from attaching to the wall of the inlet pipe 111.

Figure 4:
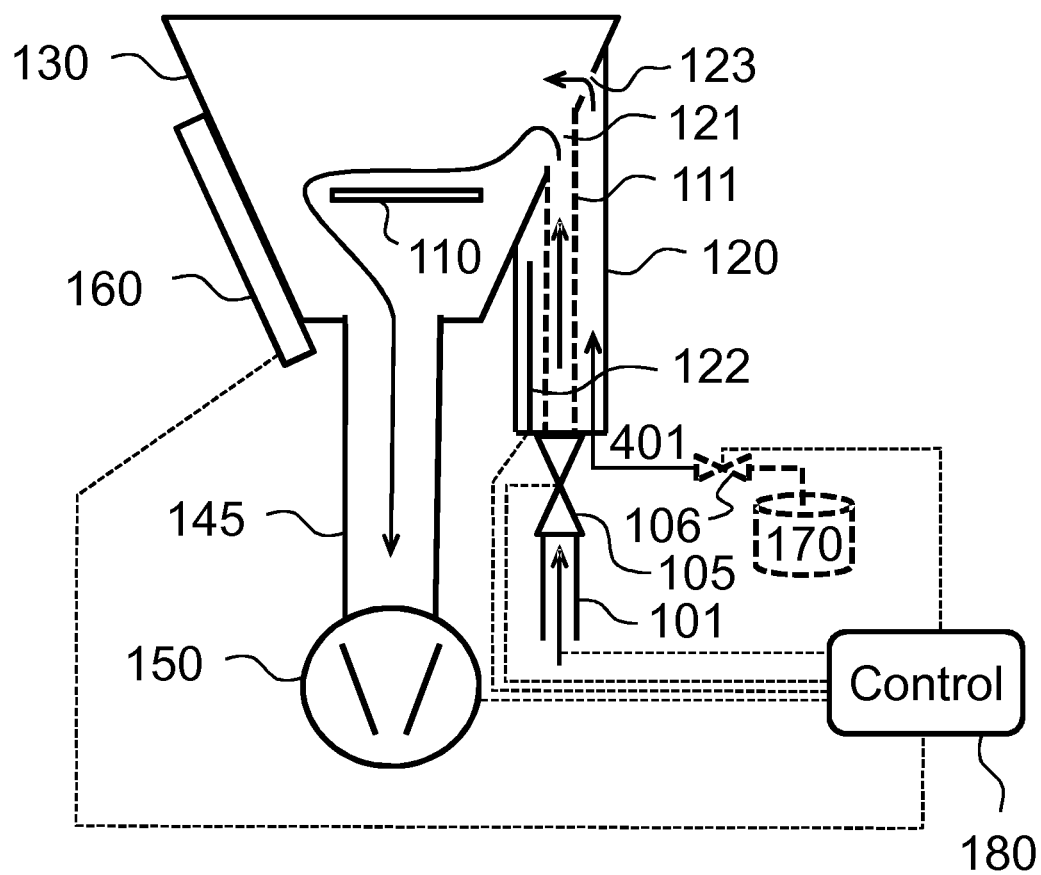
FIG. 4 shows an apparatus with further embodiments in which an outer chamber is omitted.

FIG. 4 shows an apparatus in accordance with yet further embodiments. The apparatus shown in FIG. 4 generally corresponds to the structural features and operation of the apparatus shown in FIGS. 1-3 except that in the apparatus shown in FIG. 4 the outer chamber 140 is omitted. The outer tube 120 forms a volume outside of the reaction chamber 130, and the in-feed line 101 extends from the pulsing valve 105 through said volume into the reaction chamber 130. The higher pressure gas is passed into the outer tube 120 from the gas source 170 via the valve 106 and via a feedthrough or similar as depicted by an arrow 401. The higher pressure gas enters the interior of the inlet pipe 111 through the gas-permeable wall. The pressure difference between the pressure of the higher pressure gas and the pressure of the reactive gas prevents the reactive gas from attaching to the wall of the inlet pipe 111. The heater 160 is optionally integrated with a reaction chamber 130 wall. The apparatus shown in FIG. 4 may optionally comprise the opening 123 that allows gas flow from the outer tube 120 into the reaction chamber 130 without passing an intermediate element.

In certain embodiments, the pressure difference over the inlet pipe 111 gas-permeable wall relates to a pulsing sequence or process via the control system 180.

Figure 5:
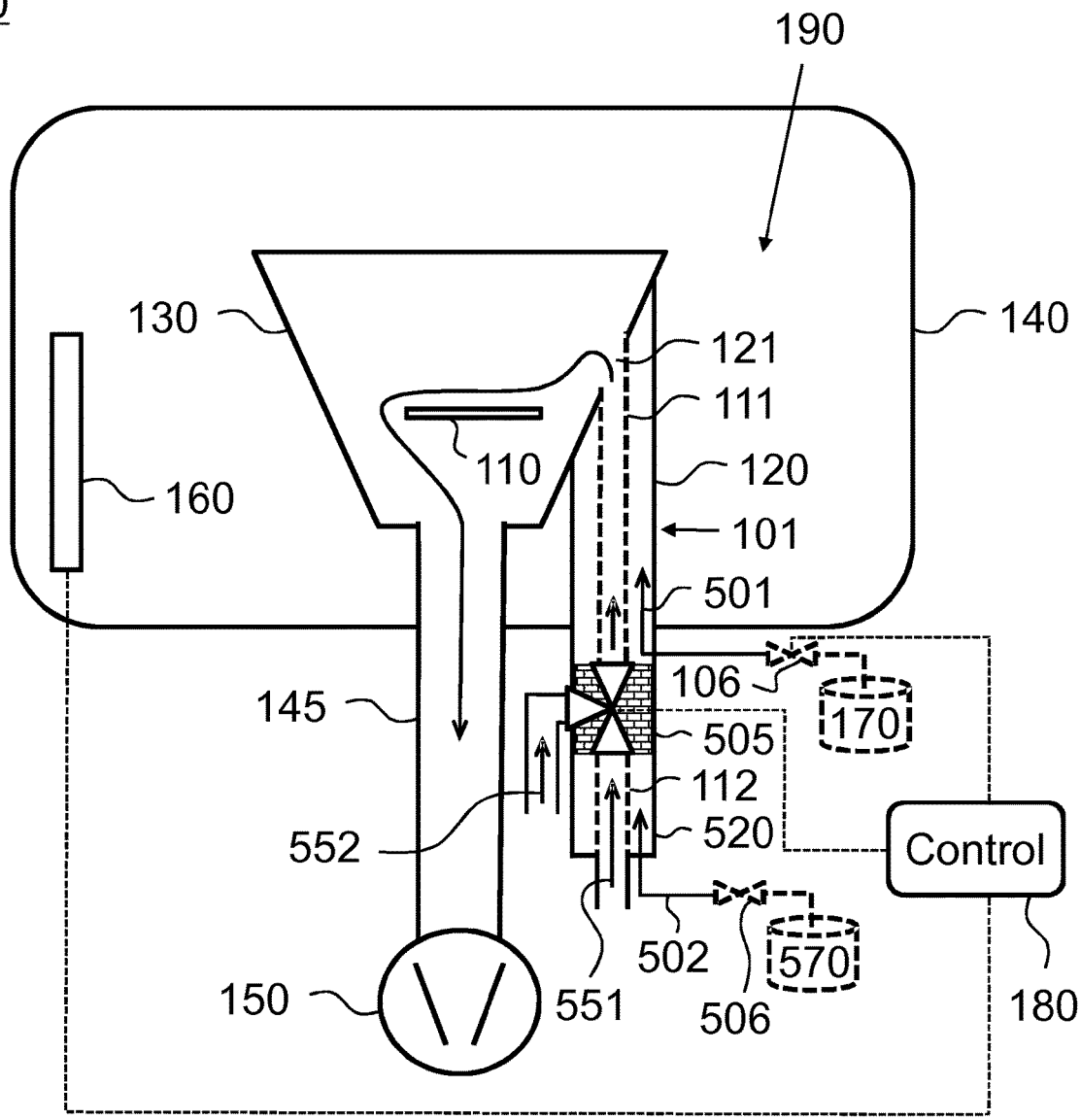
FIG. 5 shows an apparatus in accordance with certain embodiments comprising a three-way valve.

FIG. 5 shows an apparatus in accordance with certain embodiments comprising a three-way valve. The apparatus shown in FIG. 5 generally corresponds to the structural features and operation of the apparatus shown in FIGS. 1-4 except that in the apparatus shown in FIG. 5 the valve 105 has been implemented as a three-way valve 505, also known as such as an ALD valve. Further, FIG. 5 shows a possible option of extending the inlet pipe 111 with the gas-permeable wall partly outside of the intermediate space 190. Further, FIG. 5 shows a possible option of extending the portion having the gas-permeable wall upstream of the valve 505. Further, FIG. 5 shows a possible option of using different surrounding fluids in different portions of the in-feed line 101.

In addition to the outer tube 120 surrounding the inlet pipe 111 downstream the valve 505, the in-feed line 101 comprises a second inlet pipe 112 with a gas permeable wall surrounded by a second outer tube 520 upstream of the valve 505. Higher pressure gas is passed into the outer tube 120 from the gas source 170 via the valve 106 similarly as described by the preceding description and as depicted by an arrow 501. The higher pressure gas enters the interior of the inlet pipe 111 through the gas-permeable wall. The pressure difference between the pressure of the higher pressure gas and the pressure of the reactive gas prevents, e.g., the reactive gas flowing within the inlet pipe 111 from attaching to the wall of the inlet pipe 111. A second higher pressure gas (which may be the same gas as or different gas than the gas from source 170) is passed into the second outer tube 520 from a gas source 570 via a valve 506 as depicted by an arrow 502. The higher pressure gas enters the interior of the second inlet pipe 112 through the gas-permeable wall. The three-way valve 505 comprises two inlets, and an outlet towards the reaction chamber 130. The reactive chemical is passed to a first inlet of the valve 505 along the second inlet pipe 112 as depicted by arrow 551. A second chemical is passed to a second inlet of the valve 505 as depicted by arrow 552. The control system 180 controls which of the inlets is/are passed through to the inlet pipe 111 via the outlet.

In other embodiments, the incoming chemical may decompose in the pipes and therefore the role of flows 552 and 551 may be exchanged.

Yet in other embodiments, the flow 551 is carrying in the reactive chemical, but the incoming gas at 502 is replaced by evacuation, i.e., the outer tube 520 is connected to an outgoing gas line (to pump/waste/recovery). The gas from the inlet pipe 112 flows through the gas-permeable wall to the outer tube 520 and therefrom to waste when it does not go through the valve 505.

The heating of the inlet pipe(s) and outer tube(s) can be implemented in a similar manner as in other embodiments.

Figure 6:
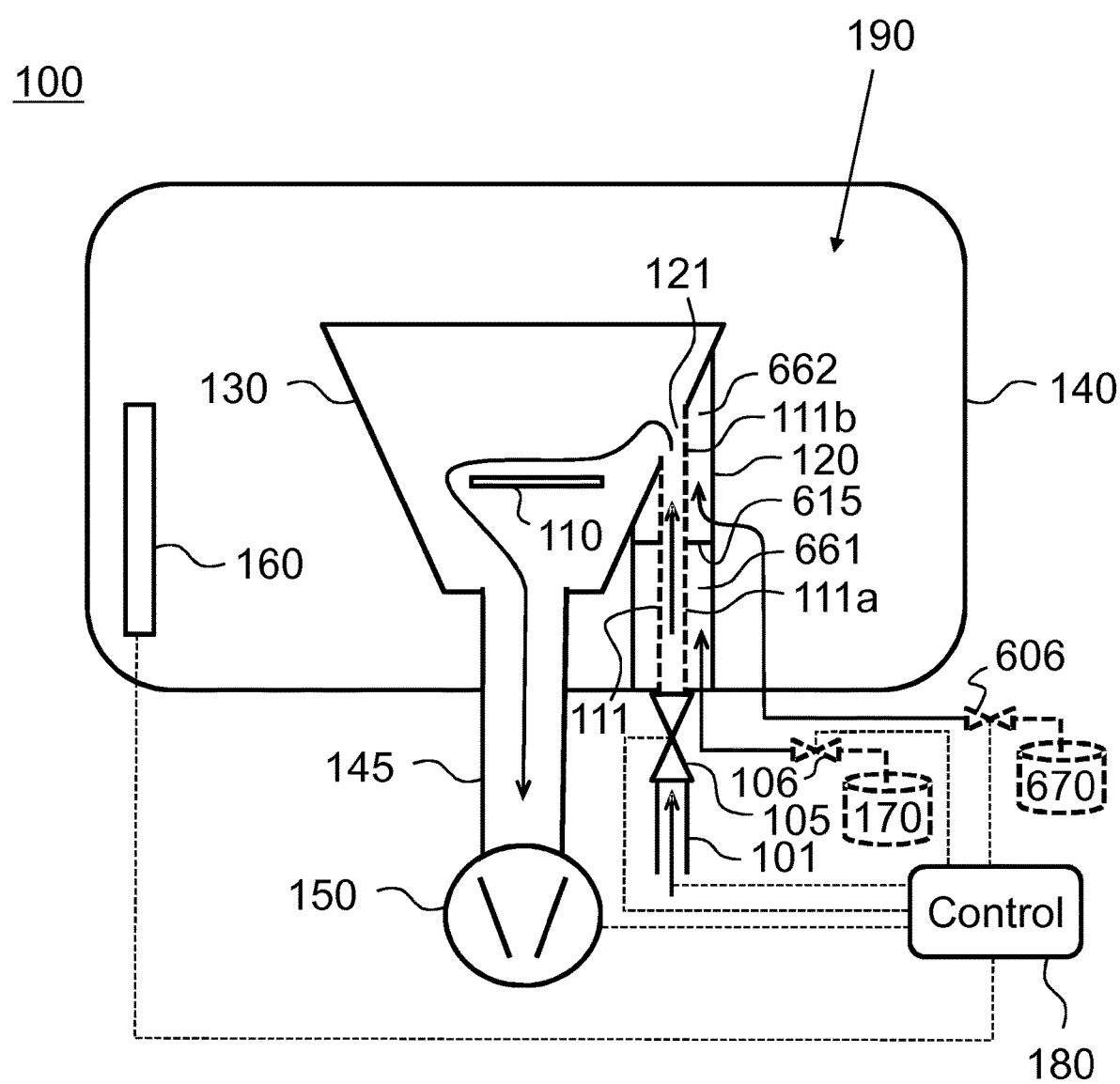
FIG. 6 shows an apparatus in accordance with further embodiments comprising separate surrounding gas volumes.

FIG. 6 shows an apparatus in accordance with further embodiments comprising separate surrounding gas volumes. The apparatus shown in FIG. 6 generally corresponds to the structural features and operation of the apparatus shown in FIGS. 1-5. However, instead of the outer tube 120 providing only a single volume surrounding the inlet pipe 111, separate and successive gas volumes are provided. In certain embodiments, each volume has its separate gas inlet. For example, in the example shown in FIG. 6 the volume surrounding the inlet pipe 111 is divided to two separate gas volumes 661 and 662 in the flow direction of the inlet pipe 111, for example, by a partition wall 615.

First fluid (which may be inactive gas) is passed into the volume 661 from the gas source 170 via valve 106. The inlet pipe 111 is divided to two sections. The first section 111$a$ is at the area of volume 661 and the second section 111$b$ at the area of volume 662. The first fluid enters the interior of the inlet pipe 111 from the volume 661 through a gas-permeable wall section 111$a$.

Second fluid (which may be the same fluid as the first fluid or different fluid) is passed into the volume 662 from a gas source 670 via valve 606. The second fluid enters the interior of the inlet pipe 111 from the volume 662 through a gas-permeable wall section 111$b$.

In the example shown in FIG. 6, the number of surrounding volumes is two. However, in other embodiments, there may be more surrounding volumes than two. In certain embodiments, the surrounding volumes are controlled in terms of prevailing pressure. In certain embodiments, the surrounding volumes are controlled in terms of prevailing temperature. In certain embodiments, the surrounding volumes are controlled in terms of flow direction. In certain embodiments, the gases passed to each of the surrounding volumes are mutually different. During certain times and/or process steps, the flow direction of fluid through the gas-permeable wall sections may be opposite or mutually different. The said control is performed by the control means 180, and/or the volumes may comprise their own control means.

In certain embodiments, each surrounding volume has its own heating means. As mentioned, the gas inlet(s) and heating means may be controlled by the control system 180, or each volume may have its own control means.

Figure 7:
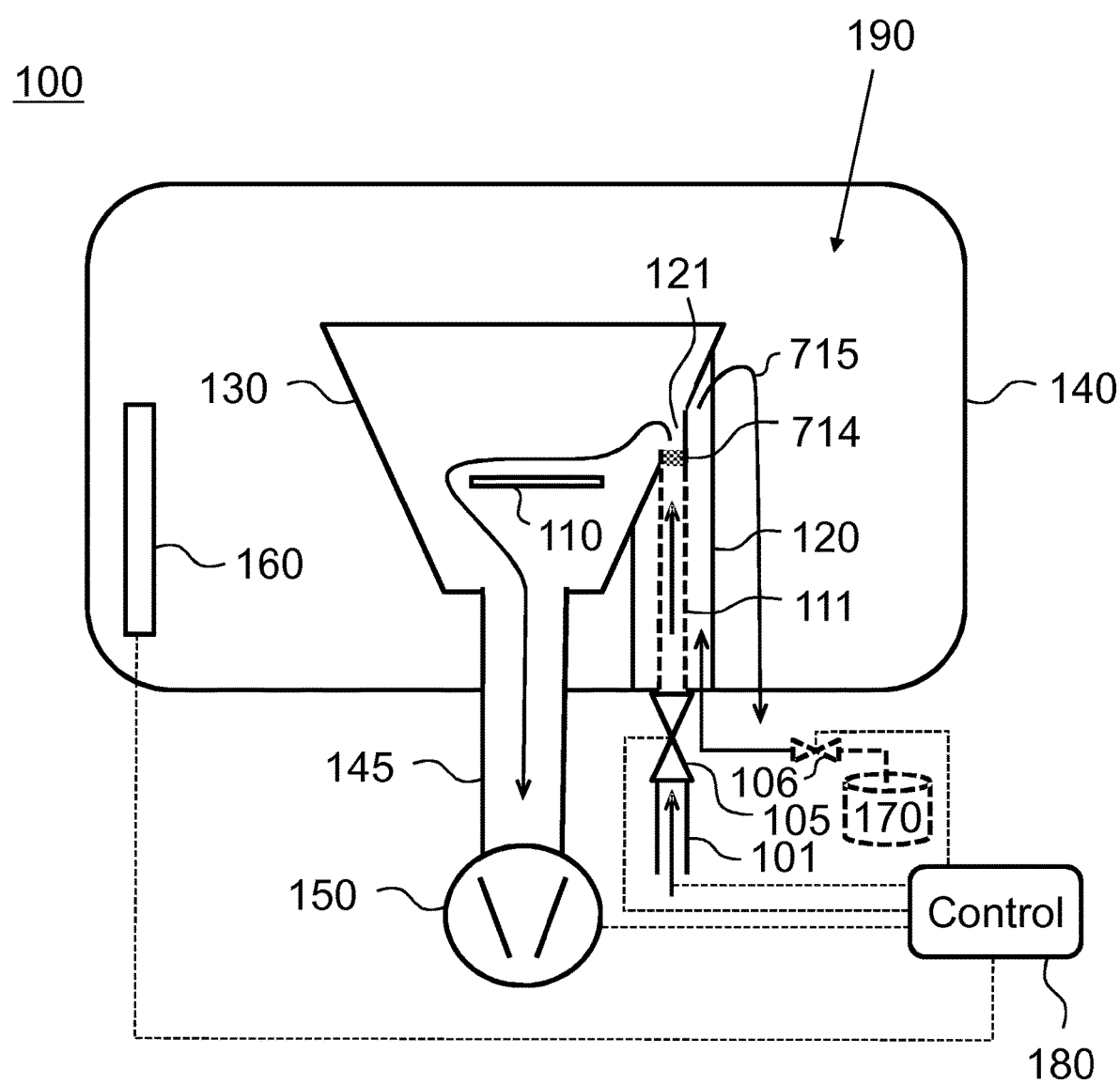
FIG. 7 shows an apparatus in accordance with further embodiments comprising a particle filter.

FIG. 7 shows an apparatus in accordance with further embodiments. The apparatus shown in FIG. 7 generally corresponds to the structural features and operation of the apparatus shown in FIGS. 1-6 except that the apparatus shown in FIG. 2 comprises an optional particle filter 714. The particle filter 714 is added to the reaction chamber side end of the inlet pipe 111 to prevent particles from entering the reaction chamber 130.

FIG. 7 also shows an optional outlet channel (waste or recovery line) 715 leading from the space between the inlet pipe 111 and the outer tube 120 to a pump (pump 150 or similar) for exhaust. In the example shown in FIG. 7 the outlet channel begins at the reaction chamber end of the surrounding volume. The pressure within the outlet channel 715 may be controlled, e.g., by shapes or means that cause a directed gas flow, such as a cyclone separation flow. The pressure control in certain embodiments reduces or obviates the need of the filter 714. The flow direction of gas in this and other embodiments may generally be controlled by the shape of the inlet pipe 111, by the orientation of the holes or pores of the gas-permeable wall material, or by plasma, or by the surface structure of the inlet pipe 111.

Figure 8:
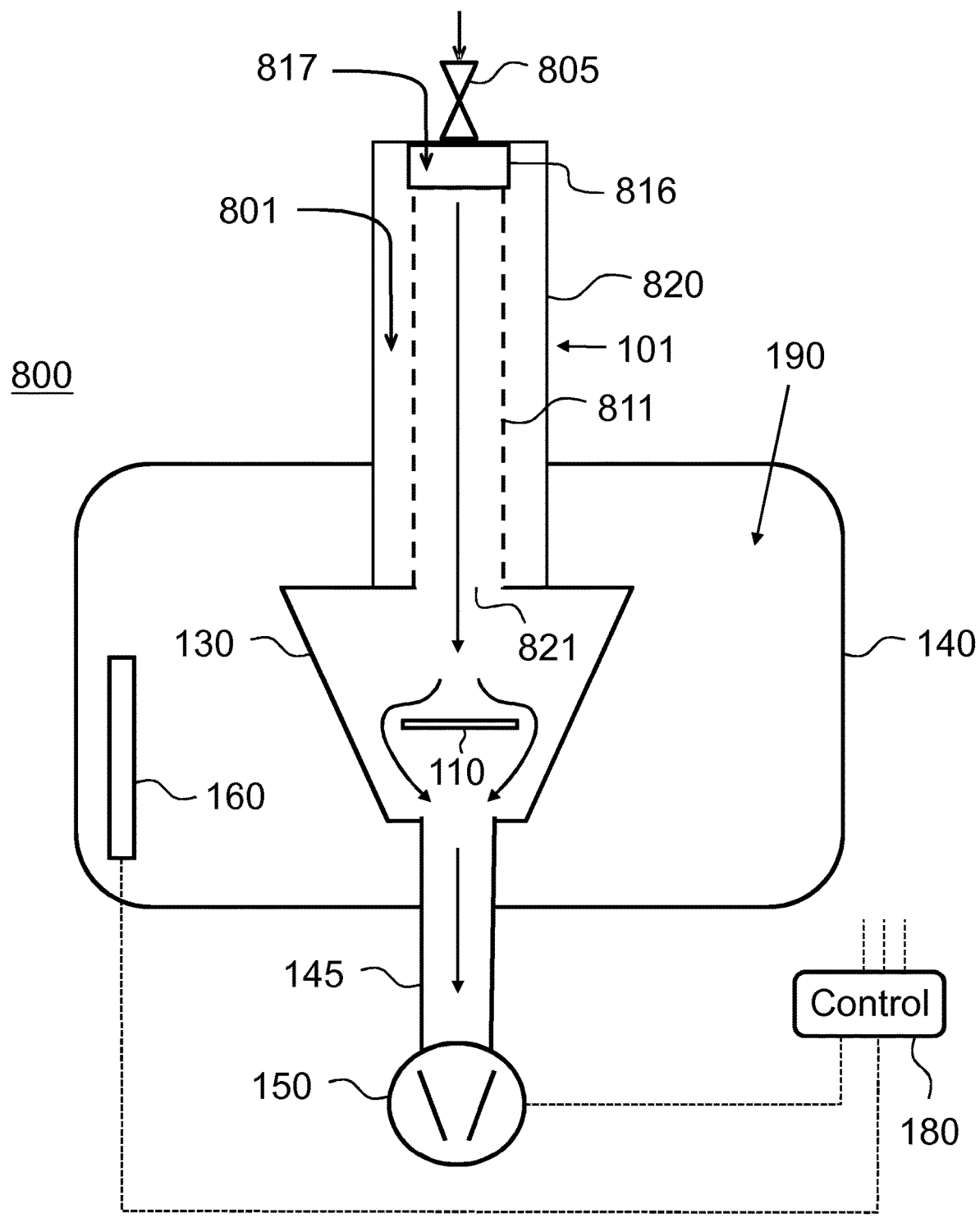
FIG. 8 shows an apparatus in accordance with yet further embodiments.

FIG. 8 shows an apparatus in accordance with yet further embodiments in which plasma may be optionally involved. The apparatus 800 shown in FIG. 8 generally corresponds to the structural features and operation of the apparatus 100 shown in FIGS. 1-7. Accordingly, a reference is made to the preceding description. However, the apparatus 800 is specifically designed for plasma assisted deposition, for example plasma assisted ALD or similar technology in particular.

The apparatus 800 comprises a reaction chamber 130 and an in-feed line 101 to provide plasma or radicals to the reaction chamber 130. The apparatus further comprises a valve 805 in the in-feed line 101 controlled by the control system 180. The valve 805 may refer to several valves or means of controlling the incoming gas flow(s) having the same or different pressures and/or same or different temperatures and/or same or different gases or mixtures of gases. Further, the apparatus 800 optionally comprises a flow guiding unit 816 which may be a gas mixer, an ejector, a porous medium or their combination to guide the gases properly onto a vertical downward stream towards the substrate 110. Further, the flow can be designed so that there is a fixed stream of gas, such as a gas flow as depicted by reference numeral 817 to the flow guiding unit 816. In an embodiment, the valve 805 is connected directly to the flow guiding unit 816.

The apparatus 800 further comprises a volume outside of the reaction chamber 130 and at least partly surrounding the in-feed line 101. In the embodiment shown in FIG. 8, an intermediate space 190 formed between the reaction chamber 130 and an outer chamber 140 surrounds both the reaction chamber 130 and the in-feed line 101. An outer tube 820 resides around the in-feed line 101. The in-feed line 101 extends from the valve 805 into the reaction chamber 130. In this portion from the valve 805 to the reaction chamber 130, the in-feed line is in the form of an inlet pipe 811 with a gas-permeable wall. The reaction chamber 130 comprises an inlet opening 821 at its top part, and the inlet pipe 811 with the gas-permeable wall extends to the inlet opening 821. However, in other embodiments the gas-permeable wall does not extend all the way to the inlet opening 821, but it only extends towards the inlet opening 821. In such embodiments, an edge of the reaction chamber 130 close to the inlet opening 821 may be a hot or heated edge to reduce sticking.

The inlet pipe 811 in certain embodiments is a porous pipe or a perforated pipe. The wall of the inlet pipe 811 in certain embodiments comprises a plurality of holes or gaps, in certain embodiments directional holes, and/or sections with gaps or slits. The pipe material used may be for example metal or ceramic. The outer tube 820 as well as the intermediate space 190 surround the inlet pipe 811. However, in the example shown in FIG. 8 the inlet pipe 811 with the gas-permeable wall is only partly in the intermediate space 190.

The volume(s) at least partly surrounding the in-feed line 101 can be heated volume(s). In certain embodiments, the reaction chamber 130 (and the intermediate space 190) are heated by a heater 160 placed within the intermediate space 190. The volume within the outer tube 820 (and inlet pipe 811) may be heated similarly as described in connection with FIG. 1. The outer tube 820 in an embodiment is provided with heat insulation.

Plasma is generated by a remote plasma generator (not shown) and it flows as a direct path within the inlet pipe 811 through the inlet opening 821 to the substrate 110. An example of a plasma generator assembly on an ALD tool is shown, e.g., in WO 2012/136875 A1.

The reactive chemical/plasma that flows within the inlet pipe 811 is prevented from coming to contact or adhering to the (inner) wall of the inlet pipe 811 (or the coming into contact or adherence is reduced) by providing higher pressure fluid (or gas) to surround the inlet pipe 811. Surrounding higher pressure gas is passed into the outer tube 820 via a feedthrough or valve or similar as depicted by an arrow 801. The higher pressure gas enters the interior of the inlet pipe 811 through the gas-permeable wall. The pressure difference between the pressure of the higher pressure gas and the pressure of the reactive gas/plasma prevents the reactive gas from attaching to the wall of the inlet pipe 811. The higher pressure gas passes through the wall of the inlet pipe 811 and mixes with the reactive gas. The mixture flows via the inlet pipe 811 through the inlet opening 821 into the reaction chamber 130 in which the substrate 110 is exposed to sequential self-saturating surface reactions as controlled by the control system 180. The substrate 110 can be loaded into the reaction chamber 130 before processing and removed from the reaction chamber 130 after processing by lowering the reaction chamber 130 in the manner as presented in PCT/FI2017/050071, or by moving it through the side via an opening. The higher pressure gas can be different inert gas than the other inert gases or gases used in plasma generation. Limiting of plasma generation to designated regions can be accomplished by selecting pressures and gases depending on the embodiment.

The remaining reactants and reaction by-products (if any) are pumped towards a vacuum pump 150 via a fore-line 145.

As presented in the foregoing, gas from the outer tube 820 may enter directly the reaction chamber 130 (as in FIG. 4) and/or enter a waste or recovery line (as in FIG. 7) and/or enter the intermediate space 190.

The inlet pipe 811 and/or mixer 816 that receives incoming gas from valve 805 may additionally or instead contain at least partially patterned areas to eject an ejector flow. In certain embodiments, this flow is directed from top, side or from a selected angle to prevent the generated plasma, or gas flowing inside this or other porous pipe (or chamber) referred to in the instant application, from coming into contact with a solid portions of surrounding surfaces.

In certain embodiments, the apparatus 100/800 contains means to adjust and in some cases means to measure pressures and/or flows to adjust the pressure difference over the gas-permeable inlet pipe 111/811, for example. Such means may include valves, mass flow controller(s), pressure sensors of gases before entering the inlet pipe 111/811 or the intermediate space 190 in between the reaction chamber 130 and a vacuum chamber (outer chamber 140) measuring the outgoing flow and/or pressure or the pressure in one of the following: inlet pipe 111/811, inlet pipe 111/811 and outer tube 120/820, and intermediate space 190.

The control system 180 can be adapted to adjust the pressure around outer tube 120/820. In some embodiments the same or independent control system can be configured to adjust the temperature in the space 190, in the inside of the outer tube 120/820 or outside of the vacuum chamber 140. The flow rate and level of vacuum can be adjusted by controlling the fore-line 145/vacuum pump 150 by the control system 180. The pressure control may in practice be performed, e.g., with such systems that are generally known as APC, Automatic Pressure Control.

In certain embodiments, more than one reactive gas is lead to the gas-permeable inlet pipe 111/811, but they are prevented from absorbing on the wall of the inlet pipe 111/811 with the aid of the flow coming through the inlet pipe 111/811 wall, or further inhibited by a (decreased) temperature of the gas coming through the inlet pipe 111/811 wall.

In yet further embodiments, there are means to induce electromagnetic radiation to the space within the outer tube 120/820 outside the gas-permeable inlet pipe 111/811 or to the intermediate space 190, which electromagnetic radiation interacts with the gas flowing within the inlet pipe 111/811. Such radiation can be UV-light or microwave radiation, induced with similar elements as denoted by reference numerals 160 and/or 122, or emitted from locations of 160 and/or 122, when produced outside of the outer chamber (vacuum chamber) 140.

Although not repeated in connection with all embodiments, the features presented in one or more embodiments as a general rule may be applied to all other embodiments. For example, the valves in different embodiments may be three-way valves although presented in the preceding only in connection with FIG. 5, etc.

Figure 9:
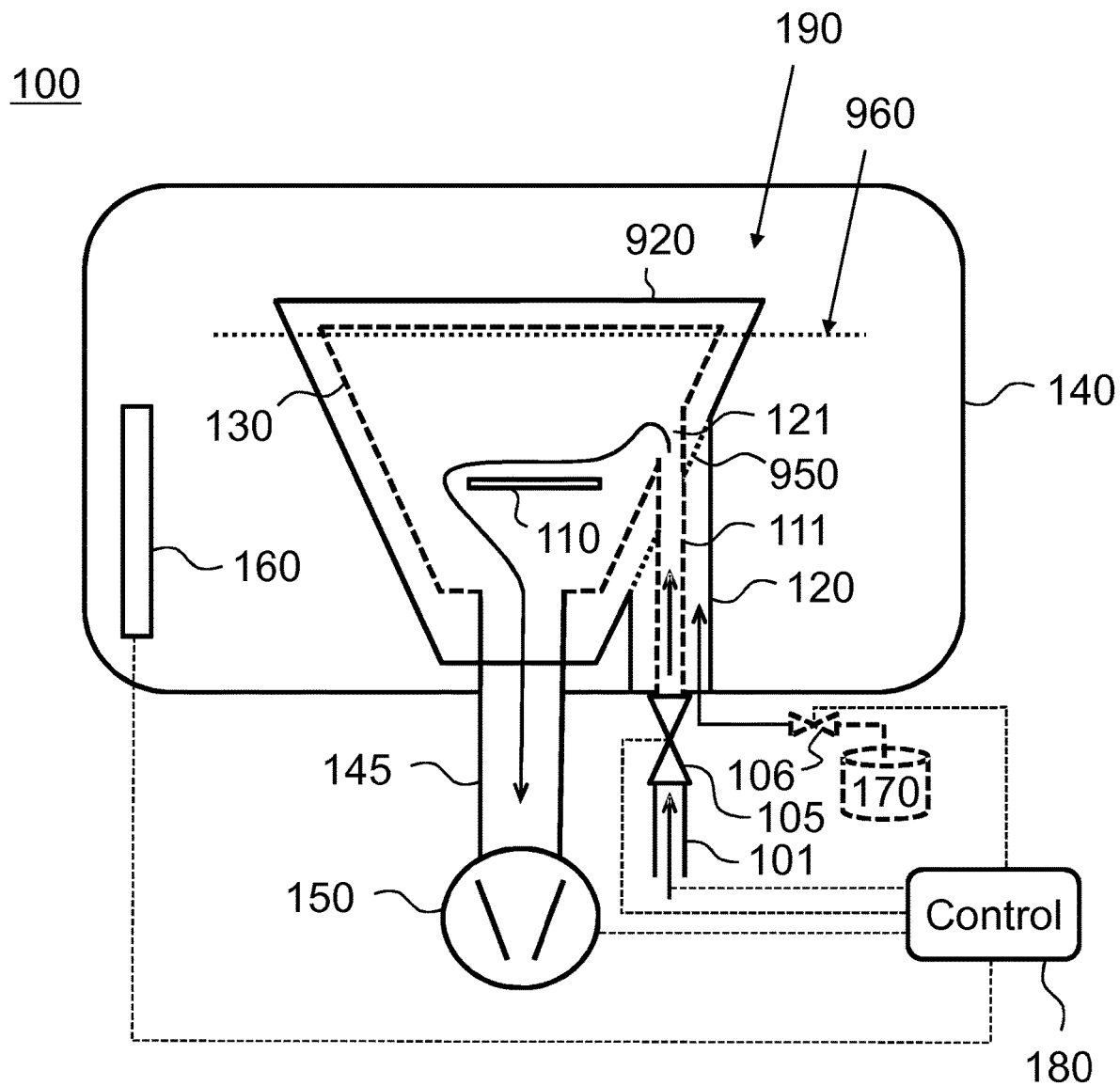
FIG. 9 shows an apparatus in accordance with yet further embodiments with a reaction chamber with a gas-permeable wall.

FIG. 9 shows an apparatus in accordance with certain further embodiments. In these embodiments, the reaction chamber 130 has gas-permeable walls. The reaction chamber walls are formed of gas-passing pathways that may include pores. Accordingly, the reaction chamber 130 may be porous. There may be provided a multitude of gas-passing pathways providing a protective flow extending along the whole inner surface of the reaction chamber 130.

The reaction chamber 130 is surrounded, at least partly, by a confined volume. The surrounding volume may be the intermediate space 190 formed between the gas-permeable wall of the reaction chamber 130 and an outer chamber 140 wall. In certain embodiments, such as shown in FIG. 9, the surrounding volume is defined by the gas-permeable wall of the reaction chamber 130 and an (optional) outer intermediate wall 920, the outer intermediate wall 920 residing in between the gas-permeable wall of the reaction chamber 130 and the outer chamber 140 wall. In an embodiment, the wall 920 conforms to the shape of the reaction chamber wall 130.

In certain embodiments, a system similar to that of FIG. 9 is implemented without the outer chamber 140. The possible heaters can be conveniently adapted in connection with the intermediate wall 920 (especially if this is used as an outer wall), and/or the apparatus can comprise elsewhere heating for the gas. If preferable for a high purity wafer coating the sample/substrate loading is made in the outer chamber 140, rather than in ambient air and pressure. An opening in the reaction chamber 130 wall for loading can be implemented in various places. FIG. 9 shows an example opening level 960 at which a reaction chamber 130 upper portion can be lifted or lower portion lowered for loading.

The apparatus is configured to provide fluid to surround and enter the reaction chamber 130 from the surrounding confined space through the gas-permeable wall of the reaction chamber 130. In certain embodiments, such as shown in FIG. 9, the apparatus comprises the inlet pipe 111 with gas-permeable wall surrounded by the outer tube 120. Higher pressure fluid may flow (or may be fed) via the outer tube 120 into the confined space in between the reaction chamber 130 wall and the wall 920. In this context, the higher pressure fluid means fluid that has pressure higher than that inside of the reaction chamber 130. Alternatively, higher pressure fluid may be fed into the confined space by its own in-feed line (without passing through the outer tube 120). This is also applicable in embodiments in which the outer tube 120 is missing and in embodiments in which the route from the outer tube 120 to the confined space is blocked by the wall 920 (in the area depicted by reference numeral 950). It is also not necessary in these embodiments that the inlet pipe 111 has gas-permeable walls. Otherwise the apparatus shown in FIG. 9 operates as described in the preceding.

Figure 10:
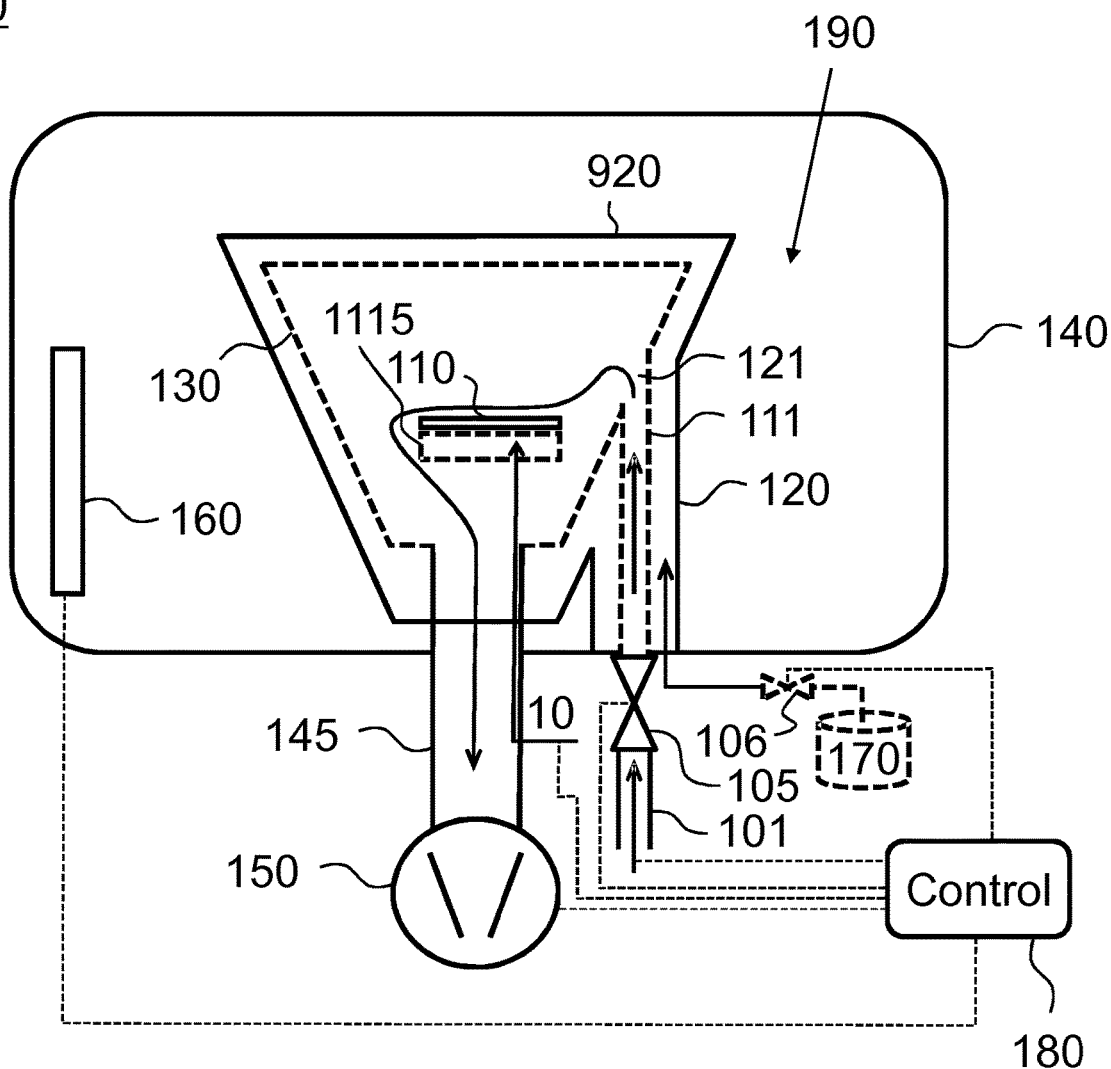
FIG. 10 shows an apparatus in accordance with another embodiment with a porous substrate holder.

FIG. 10 shows an embodiment in which a substrate holder (or chuck) 1115 under the substrate 110 comprises at least one gas-permeable wall. The substrate holder 1115 comprises a hollow space inside of the substrate holder 1115. Inactive gas is fed into the hollow space, e.g., via a channel 10 controlled by the control system 180. The route of the channel 10 depends on the embodiment. The channel 10 may, for example, extend via the fore-line 145. The substrate holder 1115 may be shaped like a Petri dish with edges to hold the substrate 110, or it may be of any other shape adapted to hold the substrate 110. The substrate holder 115 may be configured at least partially to prevent gas-based deposition on its selected surface(s).

In an embodiment, at least a surface of the substrate holder 1115 facing upwards or facing a substrate 110 (or substrates in case there are more than one) is gas-permeable. In certain embodiments, the substrate holder 1115 comprises side surfaces, and these are also gas-permeable. In certain embodiments, the whole substrate holder 1115, i.e., each of the outer surfaces of the substrate holder 1115 are gas-permeable.

In certain embodiments, the substrate holder walls that are gas-permeable are formed of gas-passing pathways that may include pores. Accordingly, the substrate holder walls concerned may be porous. There may be provided a multitude of gas-passing pathways in each of the gas-permeable substrate holder wall.

Inactive gas with pressure higher than the pressure prevailing in the surroundings of the substrate holder 1115 passes from the hollow space through the gas-permeable walls to outside of the substrate holder 1115. The passing through the gas-permeable wall(s) of the substrate holder 1115 establishes a protecting flow to prevent or reduce material growth on the outer surfaces of the substrate holder 1115. The passing through a wall facing the substrate 110 prevents or reduces material growth on a backside of the substrate 110.

The substrate holder 1115 may be gas-permeable without the need of other walls of the system (e.g., reaction chamber wall, inlet pipe wall) to be gas-permeable.

Instead of providing a separate substrate holder, the substrate holder may form part of the reaction chamber or form part of a reaction chamber structure.

Figure 11:
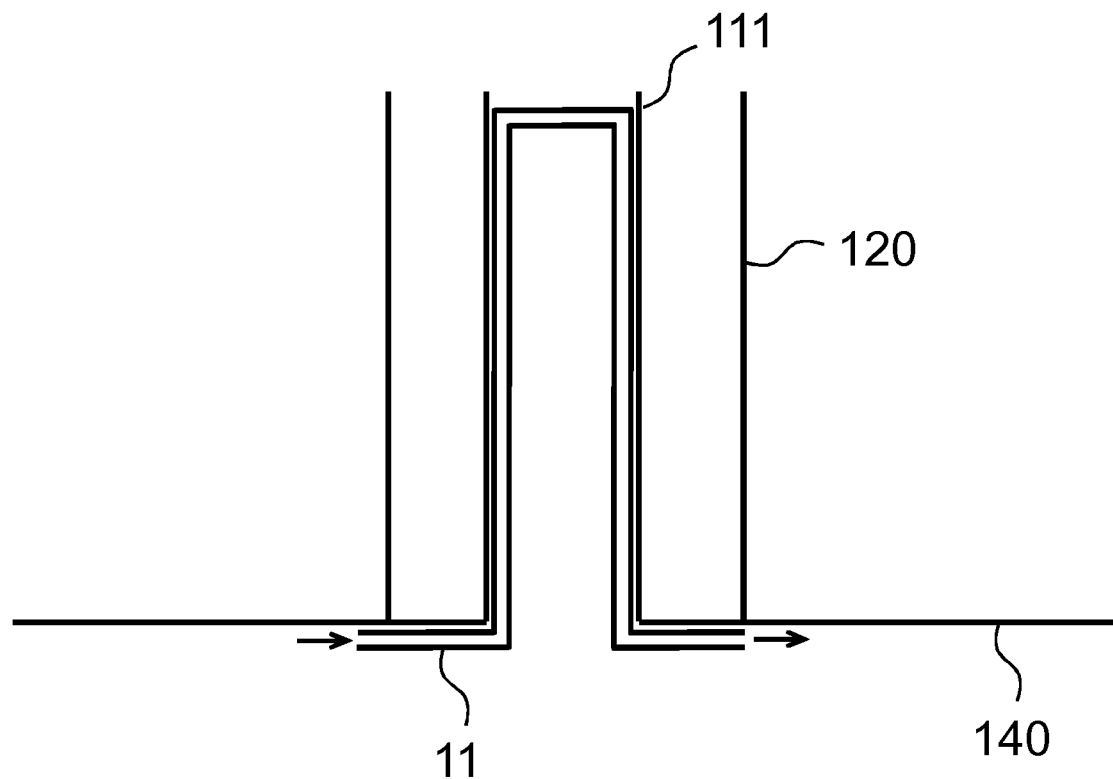
FIG. 11 shows fluid channels within an inlet pipe in accordance with further embodiments.

FIG. 11 shows fluid channels within an inlet pipe in accordance with further embodiments. In these embodiments, the inlet pipe 111 (or outer tube 120, or any other confined space) comprises within the inlet pipe 111 one or more separate fluid channels 11. Separate herein means that any material flowing within the separate fluid channels 11 is in no fluid communication with the chemical flow in the inlet pipe 111. As an example, the channel(s) 11 may be made of 3D printed material. In further embodiments, the channel 11 may be a welded pipe. In certain embodiments, the channel 11 has a spiral form. The channel(s) 11 may be air channel(s). The channel(s) 11 may be located on the inner surface of the inlet pipe 11 (or of a structure bounding a confined space). In certain embodiments, the channels 11 provide the inlet pipe 111 with a heating or a cooling effect by flowing fluid within the channel 11 having a temperature different from the temperature of chemical or reactive chemical flow in the inlet pipe.

Figure 12:
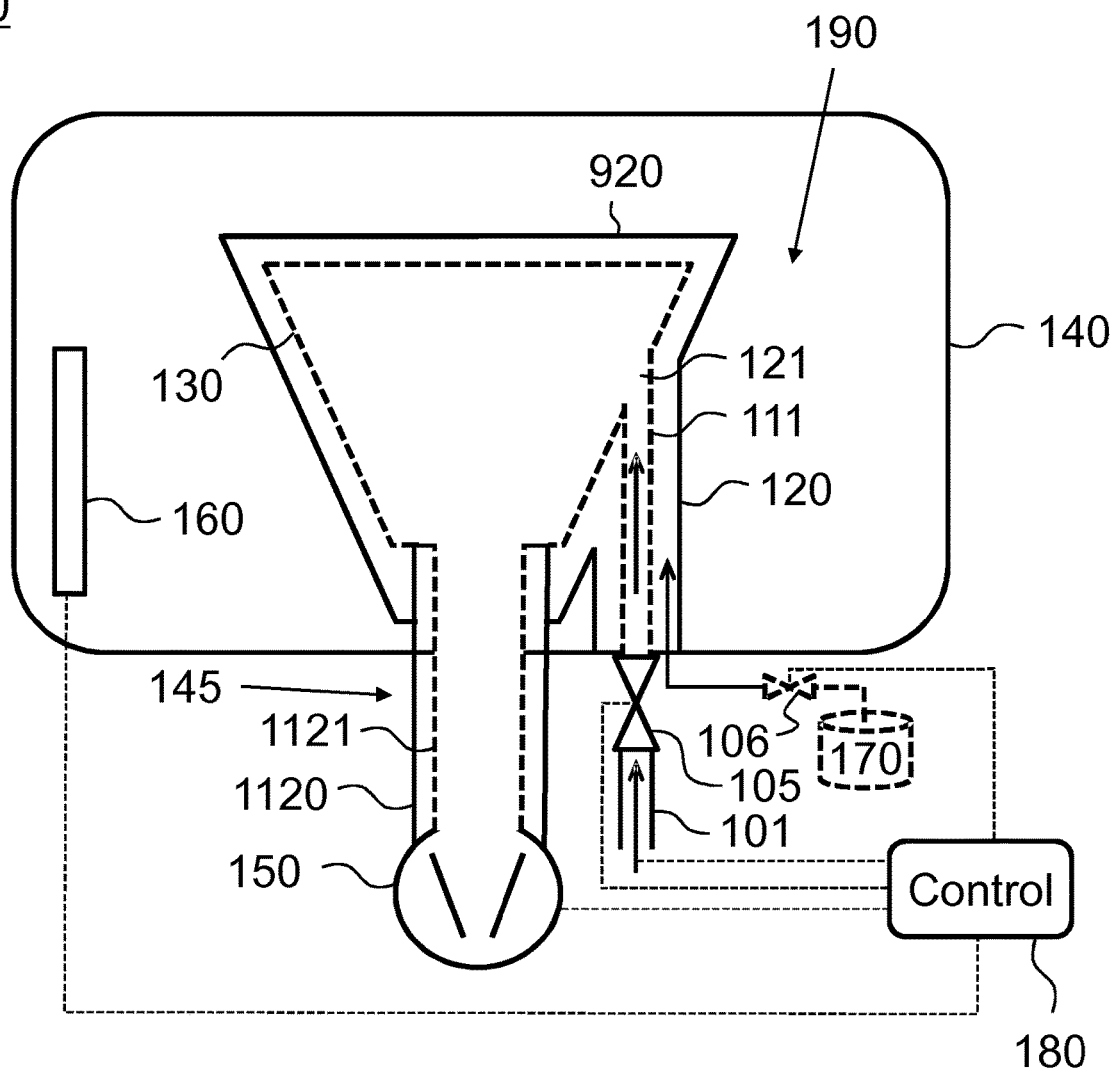
FIG. 12 shows an apparatus in accordance with yet other embodiments.

FIG. 12 shows an apparatus in accordance with yet other embodiments. The apparatus shown in FIG. 12 corresponds to the structural features and operation of the apparatus shown in the preceding, especially to those shown in FIGS. 9 and 10. In addition, the apparatus shown in FIG. 12 comprises a fore-line structure having an inner pipe 1121 surrounded by an outer tube 1120. The fore-line 145 extends from the reaction chamber 130 to or towards the pump 150. In this portion, the inner pipe 1121 is in the form of a pipe with a gas-permeable wall. The portion having the gas-permeable wall can extend all the way from the reaction chamber 130 to the pump 150, or a shorter distance. Fore-line structures usually contain at least one valve in between the pump and the reaction chamber, which is (are) omitted from the drawings.

The chemical(s) that flows within the fore-line 145 (within the inner pipe 1121) is prevented from coming to contact or adhering to the (inner) wall of the inner pipe 1121 (or the coming into contact or adherence is reduced) by providing higher pressure fluid (or gas) to surround the inner pipe 1121. Especially in the pipe 1121, it may be preferable to prevent a chemical reaction by increasing or decreasing the flowing fluid temperature, by controlling the temperature of the porous pipe 1121 or the incoming gas. Surrounding higher pressure gas is passed into the outer tube 1120 via a feedthrough or valve or similar in a similar manner as presented in the preceding e.g. in the context of describing passing higher pressure fluid into the inlet pipe 111. For example, the higher pressure gas may be passed into the outer tube 1120 (formed of a gas-impermeable wall) from a gas source via a valve. The higher pressure gas enters the interior of the inner pipe 1121 through the gas-permeable wall. The pressure difference between the pressure of the higher pressure gas and the pressure of the chemical(s) flowing within the inner pipe 1121 prevents the said chemical(s) from attaching to the wall of the inner pipe 1121.

In some embodiments, there is at least one valve before the pump 150. The at least one valve may be within the portion of the fore-line 145 having the gas-permeable wall or downstream of that portion. A possible option of dividing the volume surrounding the inner pipe 1121 to two separate gas volumes (similar to those of 661 and 662 in FIG. 6) in the flow direction of the inner pipe 1121, for example, by a partition wall (similar to 615 in FIG. 6) may also be realised. In addition or alternatively, other features or operations described in the context of the inlet pipe embodiments are also applicable here. Some parts of a typical ALD reactor have not been drawn in FIG. 12 for the sake of clarity.

Figure 13:
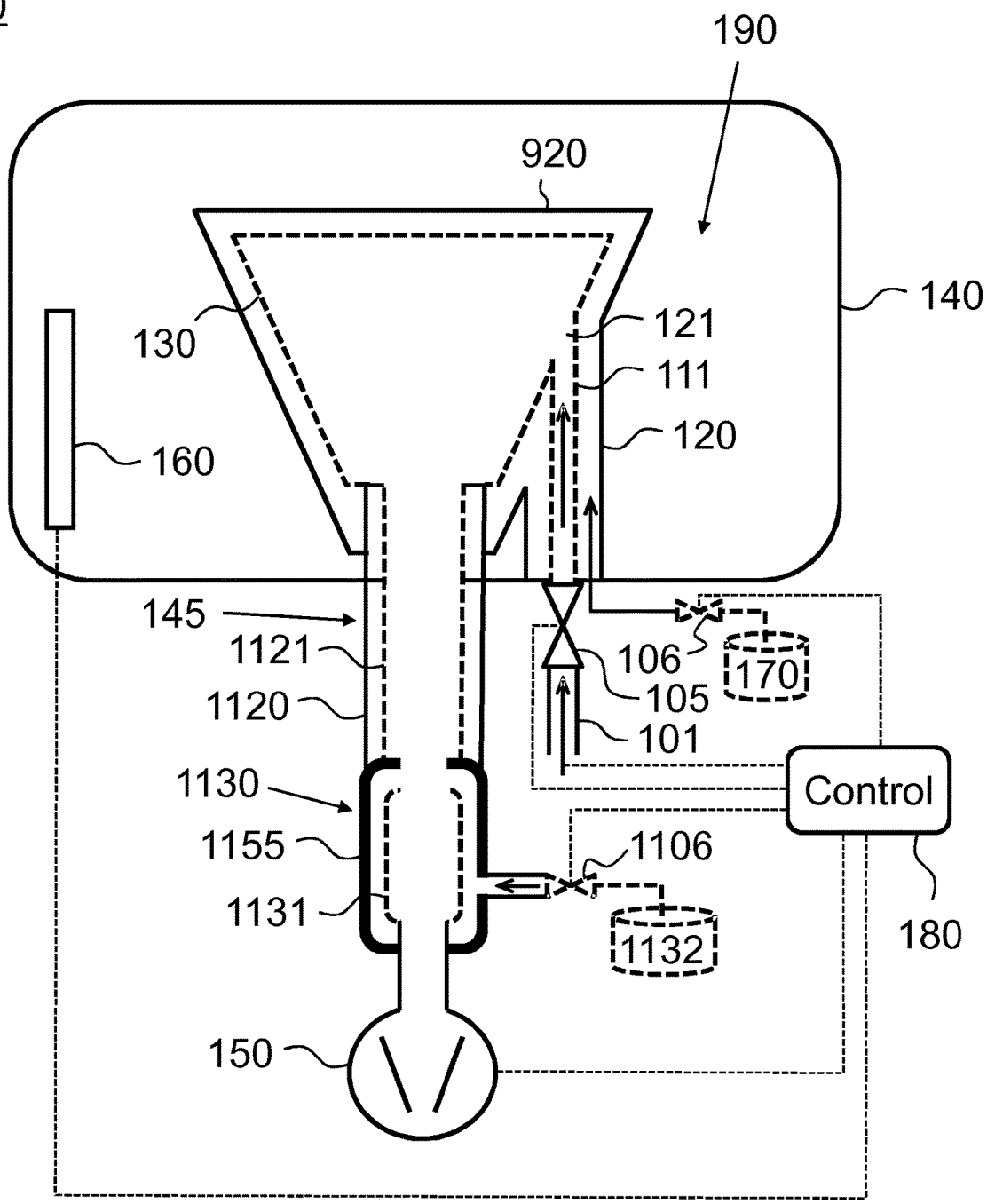
FIG. 13 shows a yet further detail in accordance with certain embodiments.

As indicated in the preceding, the pump fore-line 145 extending from the reaction chamber 130 to the pump 150 can contain one or more intervening parts. FIG. 13 shows an intervening particle trap 1155 before the pump 150. The pump fore-line 145 shown in FIG. 13 has a similar structure compared to that shown in FIG. 12. Accordingly, the inner pipe 1121 is surrounded by an outer tube 1120. The fore-line 145 extends from the reaction chamber 130 towards the pump 150. In the portion between the reaction chamber 130 and the trap 1155, the inner pipe 1121 is in the form of a pipe with a gas-permeable wall.

Conventionally traps have a second chemical coming in from a route other than a route coming from the reaction chamber 130 to generate solid products of the chemicals in the trap. In the embodiment shown in FIG. 13, a second chemical (e.g., water or water vapor in case the other reactive chemical is e.g. TMA, trimethylaluminum) is fed from a precursor container 1132 via a valve 1106 into the trap 1155 as controlled by the control system 180.

The trap 1130 may also have in some embodiments an inner wall 1131 separating a volume which receives a flow from the reaction chamber 130 via the fore-line 145 from a surrounding volume on the other side of the inner wall 1131 receiving a flow from the valve 1106. The said surrounding volume may be delimited by a trap (gas-impermeable) outer wall.

The inner wall 1131 or at least a portion of the inner wall 1131 is gas-permeable in certain embodiments. The flow from the container 1132 can be ON or OFF for the whole substrate processing process, part of the deposition or processing cycle, or controlled to be in a different state at different stages of the substrate processing process. For example, water vapor can be disposed through the porous wall (inner wall) 1131 during and immediately after the TMA pulses, but during other times inert gas can flow in with a smaller flow rate.

Otherwise the apparatus shown in FIG. 13 corresponds to the structural features and operation of the apparatus shown in FIG. 12.

The following presents an example of working conditions within the disclosed apparatus or reactor:

inlet gas flow of 0.001-20000 sccm, or 1-1000 sccm, for example 200 sccm; the inlet gas flow may include carrier gas which may be the same gas as the gas coming though the gas-permeable walls of the inlet pipe inlet gas temperature of −60° C. to 1500° C., or 20 to 300° C., for example 100° C.; the desired temperature may be realized, e.g., with a tungsten heater on porous aluminum oxide gas temperature in the intermediate space: from temperature 0° C. to 900° C., or 50-500° C., or 80-450° C., for example 100° C.

gas flow into the intermediate space: 0.001-10000 sccm, or 10-2000 sccm, or 50-500 sccm, or 100-200 sccm (there may be other means, such as a leakage towards, e.g., the pump 150 or a separate outlet line, to remove gas from the intermediate space (not shown))

gas flow in between the outer tube and the inner pipe (inlet pipe): 0.001-1000 sccm, or 0.1-100 sccm, or 1-10 sccm adjusted so that there is a pressure difference to enable gas flow to a desired direction across the inlet pipe and/or through the gas-permeable wall gas flow in between the inner part of the reaction chamber and its exterior, being the intermediate space 190 or the confined space on the reaction chamber side of wall 920: 0.001-1000 sccm, or 0.1-100 sccm, or 1-10 sccm adjusted so that there is a pressure difference to enable gas flow to a desired direction across the and/or through the gas-permeable wall in question gas in between the outer tube and the inlet pipe having the temperature of −60° C. to 1000° C., or 80-800° C., or 10-300° C. depending on the chemicals used.

In accordance with certain process examples, chemicals such as Cu(acac)$_2$ (Cupric acetylacetonate|C$_{10}$H$_{16}$CuO$_4$) are processed in the reaction chamber 130 at reaction temperatures <100° C., such as 90° C., where the precursor is source in question is kept at a higher temperature, for example, a temperature >100° C., such as 110° C., and the gas coming through the gas-permeable wall of the inlet pipe 111/811 decreases the total temperature of the incoming gas to such a temperature that it adjusts the reaction chamber 130 to the temperature of said 90° C. Other chemical for the deposition of Cu$_2$O in the said ALD process can be water or O$_2$ for example. By using the presented embodiments, the temperature of one reactive gas may be increased, or reactive ions to ease the reaction may be created.

Another process example is such where, e.g., $RuCp_2$ precursor flows in the in-feed line 101 at a temperature of 85° C., for example, to prevent decomposition of the precursor in a precursor source container or in the valve 105/505. The precursor is heated by the surrounding gas coming through the gas-permeable wall of the inlet pipe 111/811 to around 300° C., i.e., to the temperature of the reaction chamber 130. The said process can be accompanied for example with $O_2$ or $O_3$, which can be heated within the inlet pipe 111/811 to the temperature of 300° C. or even higher, enabling a decreased $RuCp_2$ temperature, respectively. In other example configurations, the $RuCp_2$ may have the source temperature of 140° C., where the pipe leading to the reaction chamber has a gradually increasing heat-gradient up to 350° C., the temperature of the reaction chamber. The reactions within the reaction chamber can be operated in more than 100° C. lower temperature when the reactive gases enter to a contact with the substrate with a different, heated, temperature pulse.

In certain embodiments, the temperature on the surface of the substrate 110 is controlled by controlling the temperature of gas entering the reaction chamber 130 by the surrounding gas entering the inlet pipe 111/811 through the gas-permeable wall. Such an apparatus or reactor comprises a first in-feed line with the presented gas-permeable wall arrangement and a second in-feed line also comprising the gas-permeable wall arrangement. The arrangement in the first in-feed line provides the reaction chamber 130 with gas having a first temperature, for example 100° C., and the arrangement in the second in-feed line provides the reaction chamber 130 with gas having a second temperature, for example 150° C. The temperature on the substrate 110 surface is controlled by the quantity of the gas flowing from the different in-feed lines (or different sources) at different times of the process or different times of the process or deposition sequence. In this way it is possible to provide different temperatures on the surface of the substrate 110 at different times (as different precursors may require different reaction temperatures). The temperature controlling method presented herein, inter alia, obviates the need for transferring the substrate between separate reaction chambers when different reaction temperatures are required.

In further embodiments, the disclosed apparatus with the gas-permeable wall in the inlet pipe 111/811 enables passivation or etching interior surface(s) of the reaction chamber 130. During the passivation or etching, there may not be a wafer inside the reaction chamber. Various ways known as such in chemistry, such as RIE (Reactive ion etching), or ALE (Atomic layer etching) may be applied, depending, e.g., on the material(s) to be removed and the material under it. An etching process can be enhanced by chemistry created in the inlet pipe 111/811 with the gas-permeable wall by heat, chemical reaction(s) or by plasma, for example.

In certain embodiments, an atomic layer etching process is performed to remove $SiCl_x$ from a silicon surface. In accordance with presented embodiments, the incoming gas into the reaction chamber is excited to remove $SiCl_x$ from the surface. The incoming gas can be excited to an adequate energy level, for example to an energy level corresponding to $Ar^+$ ion energy level conventionally used in etching processes.

In certain embodiments, the gas-permeable wall of any of the inlet pipe 111/811, the reaction chamber 130, or the substrate holder 1115, comprises one or more gas channels within the wall material so as to provide ameliorated spreading of protective gas to out of the surface of the part in question.

In the disclosed apparatus, even one thermodynamically stable material, or multiple materials, can have a wide range of reactions with the aid of catalytic surfaces that are catalytic to gases inside the inlet pipe (or to at least one chemical, such as one flowing through the gas-permeable wall). Some of the gases may be further affected by plasma or electromagnetic radiation. Short-lived product(s) may be created. In general terms, an example of this is that gas A is pulsed to the inlet pipe. Gas B comes through the gas-permeable wall to meet A within the inlet pipe. The gases A and B are selected so that they do not react on the substrate 110 (considering the state of the reaction, ALD for example), but A and B produce, in conditions within the inlet pipe, gas C (i.e., A+B→C). Gas C reacts on the substrate 110 surface as desired. Further, by a catalytic reaction, A and B* produce D in conditions within the inlet pipe (i.e., A+B*→D), a reaction which would not occur without, e.g., a catalyst. When appropriate, the particle filter (see filter 714 is FIG. 7) can also be selected so that it removes at least partly, at least one of the chemicals mentioned in the preceding reactions.

When a pulsing valve is not immediately next to the reaction chamber and/or the pulsing valve is not a hot valve, the adsorption of various chemicals, such as water, occurs spontaneously, especially for metal surfaces. In certain embodiments, such an adsorption surface can be covered by a proper gas flow separating the chemicals from the walls of the pipe that they are traveling in. Furthermore, other possible places of contact due to, e.g., turbulence are constantly purged with hot fluid, for example.

Without limiting the scope and interpretation of the patent claims, certain technical effects of one or more of the example embodiments disclosed herein are listed in the following. A technical effect is providing minimized adherence of chemical on the infeed-line(s). Since the surrounding gas is pushing through the inlet pipe wall, gas contact of the reactive chemical with the inlet pipe wall is minimized. A further technical effect is providing heating or cooling of the reactive chemical within the inlet pipe as desired. A yet another technical effect is mixing of reactive gas with an inactive gas within the inlet pipe. A yet another technical effect is causing a reaction between surrounding reactive gas and the chemical flowing within the inlet pipe to produce a desired further compound required in the reaction chamber. A technical effect is the heating of the gas flowing in the in-feed line right after the valve (particularly, a pulsing valve in the in-feed line), or in some embodiments before the valve. A technical effect is enabling reaction(s) of material flowing into the reaction chamber with the aid of spontaneous chemical reaction(s) within the inlet pipe before the reaction chamber.

The foregoing description has provided by way of non-limiting examples of particular implementations and embodiments of the present disclosure a full and informative description of the best mode presently contemplated by the inventors for carrying out the disclosed embodiments. It is however clear to a person skilled in the art that the present disclosure is not restricted to details of the embodiments presented above, but that it can be implemented in other embodiments using equivalent means without deviating from the characteristics of the present disclosure.

Furthermore, some of the features of the above-disclosed embodiments of this present disclosure may be used to advantage without the corresponding use of other features. As such, the foregoing description should be considered as merely illustrative of the principles of the present disclosure, and not in limitation thereof. Hence, the scope of the disclosed embodiments is only restricted by the appended patent claims.

The invention claimed is:

1. A substrate processing apparatus, comprising:
a reaction chamber with an inlet opening;
an in-feed line external to the reaction chamber to provide a reactive chemical into the reaction chamber via the inlet opening;
incoming gas flow control means in the in-feed line, the in-feed line extending from the flow control means to the reaction chamber, the in-feed line in this portion between the flow control means and the reaction chamber having the form of an inlet pipe with a gas-permeable wall, the inlet pipe with the gas-permeable wall extending from the flow control means towards the inlet opening through a volume at least partly surrounding the inlet pipe; and
the apparatus being configured to provide fluid to surround and enter the inlet pipe in said portion.

2. The apparatus of claim 1, comprising:
an outer tube around the inlet pipe configured to provide the volume at least partly surrounding the inlet pipe.

3. The apparatus of claim 2, wherein the apparatus is configured to pass inactive gas in between the inlet pipe and the outer tube.

4. The apparatus of claim 2, wherein the apparatus is configured to pass reactive fluid in between the inlet pipe and the outer tube causing a reaction between the reactive chemical and said reactive fluid within the inlet pipe.

5. The apparatus of claim 1, wherein the apparatus comprises an intermediate space in between the reaction chamber and an outer chamber wall, the intermediate space providing a volume at least partly surrounding the in-feed line, and a feedthrough in the outer chamber wall to pass inactive gas into the intermediate space.

6. The apparatus of claim 1, comprising a heater in the volume at least partly surrounding the inlet pipe.

7. The apparatus of claim 2, comprising at least one heater element in a space in between the inlet pipe and the outer tube.

8. The apparatus of claim 1, wherein the apparatus is configured to provide heating or cooling of the reactive chemical within the inlet pipe by the surrounding fluid.

9. The apparatus of claim 2, comprising an opening from the outer tube directly to the reaction chamber.

10. The apparatus of claim 1, wherein the inlet pipe comprises at least one of the following: a gas-permeable pipe, a porous pipe, a perforated pipe, and a pipe section or sections with a plurality of gas-permeable gaps.

11. The apparatus of claim 1, wherein the incoming gas flow control means is a three-way valve.

12. The apparatus of claim 1, comprising a second inlet pipe with a gas permeable wall surrounded by a second outer tube upstream of the incoming gas flow control means.

13. The apparatus of claim 2, wherein the outer tube comprises a heat-insulating layer, or the apparatus comprises a heat-insulating layer around the outer tube.

14. The apparatus of claim 1, comprising a plurality of separate and successive gas volumes surrounding the gas-permeable wall inlet pipe in the flow direction of the inlet pipe.

15. The apparatus of claim 1, comprising a particle filter at a reaction chamber end of the inlet pipe.

16. The apparatus of claim 2, comprising an outlet channel from the space between the inlet pipe and the outer tube to a pump or comprising an opening from the outer tube directly to the reaction chamber.

17. The apparatus of claim 1, wherein the reaction chamber is formed of porous material or comprises gas-permeable walls.

18. The apparatus of claim 1, comprising a substrate holder comprising at least one gas-permeable wall.

19. The apparatus of claim 1, comprising a pump fore-line downstream of the reaction chamber, the pump fore-line having the form of a pipe with a gas-permeable wall.

20. A method for operating a substrate processing apparatus, comprising: providing a reactive chemical into a reaction chamber of the apparatus via an in-feed line and through a reaction chamber inlet opening, the in-feed line being external to the reaction chamber; controlling the in-feed line by incoming gas flow control means, the in-feed line extending from the flow control means to the reaction chamber, the in-feed line in this portion between the flow control means and the reaction chamber having the form of an inlet pipe with a gas-permeable wall, the inlet pipe with the gas-permeable wall extending from the flow control means towards the inlet opening through a volume at least partly surrounding the inlet pipe; and providing fluid to surround and enter the inlet pipe in said portion.

21. The apparatus of claim 1, wherein the inlet pipe with a gas-permeable wall extends from the flow control means to the inlet opening.

22. The apparatus of claim 1, wherein the gas-permeable wall extends from the flow control means to the inlet opening.

23. The apparatus of claim 1, wherein the inlet opening opens directly into the reaction chamber.

* * * * *